US012693595B2

(12) United States Patent
Lee et al.

(10) Patent No.: US 12,693,595 B2
(45) Date of Patent: Jul. 28, 2026

(54) ORGANOMETALLIC COMPOUND COMPRISING A METAL COMBINED WITH AT LEAST ONE LIGAND CONTAINING FOUR OR MORE FLUORINE ATOMS, RESIST COMPOSITION COMPRISING THE SAME, AND METHOD OF FABRICATING SEMICONDUCTOR DEVICE USING THE SAME

(71) Applicant: SAMSUNG ELECTRONICS CO., LTD., Suwon-si (KR)

(72) Inventors: Jin-Kyun Lee, Suwon-si (KR); Chawon Koh, Suwon-si (KR); Ye-Jin Ku, Suwon-si (KR); Tsunehiro Nishi, Suwon-si (KR); Hyunwoo Kim, Suwon-si (KR); Hyung-Ju Ahn, Suwon-si (KR)

(73) Assignees: SAMSUNG ELECTRONICS CO., LTD., Suwon-si (KR); INHA UNIVERSITY RESEARCH AND BUSINESS FOUNDATION, Incheon (KR)

( * ) Notice: Subject to any disclaimer, the term of this patent is extended or adjusted under 35 U.S.C. 154(b) by 609 days.

(21) Appl. No.: 18/120,248

(22) Filed: Mar. 10, 2023

(65) Prior Publication Data

US 2023/0400764 A1 Dec. 14, 2023

(30) Foreign Application Priority Data

Jun. 14, 2022 (KR) ........................ 10-2022-0072386

(51) Int. Cl.
*G03F 7/004* (2006.01)
*C07F 7/22* (2006.01)
*G03F 7/16* (2006.01)

(52) U.S. Cl.
CPC .......... *G03F 7/0042* (2013.01); *C07F 7/2224* (2013.01); *G03F 7/168* (2013.01)

(58) Field of Classification Search
CPC ............................. G03F 7/0042; G03F 7/0043
See application file for complete search history.

(56) References Cited

U.S. PATENT DOCUMENTS

| | | | | |
|---|---|---|---|---|
| 8,366,967 | B2 | 2/2013 | Keszler et al. | |
| 8,415,000 | B2 | 4/2013 | Stowers et al. | |
| 8,710,497 | B2 | 4/2014 | Kim et al. | |
| 9,176,377 | B2 | 11/2015 | Stowers et al. | |
| 9,281,207 | B2 | 3/2016 | Stowers et al. | |
| 9,310,684 | B2 | 4/2016 | Meyers et al. | |
| 9,823,564 | B2 | 11/2017 | Stowers et al. | |
| 10,025,179 | B2 | 7/2018 | Meyers et al. | |
| 11,143,961 | B1 | 10/2021 | Lewis et al. | |
| 12,360,451 | B2 * | 7/2025 | Koh | G03F 7/0043 |
| 2017/0102612 | A1 * | 4/2017 | Meyers | G03F 7/168 |
| 2019/0308998 | A1 | 10/2019 | Cardineau et al. | |
| 2019/0310551 | A1 | 10/2019 | Minegishi et al. | |
| 2021/0063876 | A1 | 3/2021 | Zi et al. | |
| 2021/0157233 | A1 | 5/2021 | Zi et al. | |
| 2021/0325782 | A1 * | 10/2021 | Zi | G03F 7/0048 |
| 2022/0299874 | A1 * | 9/2022 | Koh | G03F 7/2006 |

FOREIGN PATENT DOCUMENTS

| | | | |
|---|---|---|---|
| KR | 10-2215511 | B1 | 2/2021 |
| KR | 10-2287507 | B1 | 8/2021 |
| KR | 10-2021-0128796 | A | 10/2021 |

* cited by examiner

*Primary Examiner* — Daborah Chacko-Davis
(74) *Attorney, Agent, or Firm* — Sughrue Mion, PLLC

(57) ABSTRACT

A resist material is combined with a ligand containing four or more fluorine atoms and is represented by the following formula: $[(R^1M)_iO_jX_k(OH)_m]\ (OH)_nR^2_p$, wherein one of "$R^1$" and "$R^2$" is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of "$R^1$" and "$R^2$" is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, "a" and "c" are each independently an integer of 0 to 20, "b" is an integer of 4 to 30, "d" and "e" are each independently an integer of 0 to 5, "M" is one metal selected from a specified list, "i" is an integer from 1 to 12, "j" is an integer of 1 to 14, "X" is a halogen selected from a specified list, "k" and "m" are each independently an integer of 0 to 6, and "n" and "p" are each independently an integer of 0 to 2.

20 Claims, 14 Drawing Sheets

| | N-TOC-6 | N-TOC-4 |
|---|---|---|
| Pattern image |  |  |
| Dose | 650 μC/$cm^2$ | 750 μC/$cm^2$ |
| CD | 30nm | 30nm |

| Pattern Fabrication Through Extreme Ultraviolet Irradiation | | |
|---|---|---|
| | N-TOC-6 | N-TOC-4 |
| Pattern image |  |  |
| Dose | 92.6mJ/$cm^2$ | 106.8mJ/$cm^2$ |
| CD | 9.0nm | 8.9nm |
| LER/LWR (nm) | 5.12/7.31nm | 5.56/9.96 |

| Pattern Fabrication Using Post-exposure Bake After Extreme Ultraviolet Irradiation | | |
|---|---|---|
| | N-TOC-6 | N-TOC-4 |
| Pattern image |  |  |
| Dose | 106.8mJ/$cm^2$ | 106.8mJ/$cm^2$ |
| CD | 8.9nm | 9.0nm |
| LER/LWR (nm) | 5.53/10.7nm | 4.31/6.74 |

ORGANOMETALLIC COMPOUND COMPRISING A METAL COMBINED WITH AT LEAST ONE LIGAND CONTAINING FOUR OR MORE FLUORINE ATOMS, RESIST COMPOSITION COMPRISING THE SAME, AND METHOD OF FABRICATING SEMICONDUCTOR DEVICE USING THE SAME

CROSS-REFERENCE TO RELATED APPLICATIONS

This application is based on and claims priority under 35 U.S.C. § 119 to Korean Patent Application No. 10-2022-0072386, filed on Jun. 14, 2022, in the Korean Intellectual Property Office, the disclosure of which is incorporated by reference herein in its entirety.

BACKGROUND

The disclosure relates to an organometallic compound comprising a metal with which at least one ligand containing four or more fluorine atoms is combined, a resist composition including the same, and a method for fabricating a semiconductor device using the same.

With development of the semiconductor industry, high integration of a semiconductor device is required, and processing technology for realizing ultra-fine patterns having a line width of 10 nm or less has emerged. The processing technique for forming the patterns has been mainly achieved by a photolithography process using a resist which is a photoresist. The photolithography process forms a resist pattern by forming a resist layer, aligning/exposing a pattern to be formed on the resist layer, and developing the resist layer. The resist applied to form the pattern is largely divided into a negative type resist or a positive type resist. Light sources used in an exposure process include a KrF light source (248 nm), an ArF light source (193 nm), an F2 excimer laser (157 nm), and an extreme ultraviolet (EUV) light source having a wavelength of 13.4 nm.

SUMMARY

One or more embodiments of the disclosure provide a resist material capable of implementing an accurate pattern.

Further, one or more embodiments of the disclosure provide a resist composition capable of implementing an accurate pattern.

Further still, one or more embodiments of the disclosure provide a method of fabricating a semiconductor device capable of forming an accurate pattern.

According to aspect of an example embodiment, a resist material is an organometallic compound comprising a metal combined with at least one ligand containing four or more fluorine atoms and represented by $[(R^1M)_iO_jX_k(OH)_m](OH)_nR^2_p$, wherein one of "$R^1$" and "$R^2$" is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of "$R^1$" and "$R^2$" is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, "a" is an integer of 1 to 20, "d" and "e" are each independently an integer of 0 to 5, "c" is an integer of 0 to 20, "b" is an integer of 4 to 30, "M" is one metal selected from Sn, Sb, Te, Ir, Ti, Bi, Po, At, In, Ag, Au, Pt, Si, Al, and Ga, "i" is an integer from 1 to 12, "j" is an integer of 1 to 14, "X" is a halogen element selected from I, Cl, F, and Br, "k" is an integer of 0 to 6, "m" is an integer of 0 to 6, "n" is an integer of 0 to 2, and "p" is an integer of 0 to 2.

According to an aspect of an example embodiment, a resist composition includes an organometallic compound and an organic solvent, wherein the organometallic compound has a structure represented by $[(R^1M)_iO_jX_k(OH)_m](OH)_nR^2_p$, wherein one of $R^1$ and $R^2$ is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of $R^1$ and $R^2$ is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, a is an integer of 1 to 20, d and e are each independently an integer of 0 to 5, c is an integer of 0 to 20, b is an integer of 4 to 30, M is one metal selected from Sn, Sb, Te, Ir, Ti, Bi, Po, At, In, Ag, Au, Pt, Si, Al, and Ga, i is an integer from 1 to 12, j is an integer of 1 to 14, X is a halogen element selected from I, Cl, F, and Br, k is an integer of 0 to 6, m is an integer of 0 to 6, n is an integer of 0 to 2, and p is an integer of 0 to 2.

According to an aspect of an example embodiment, a method of fabricating a semiconductor device includes preparing a resist composition including an organometallic compound and an organic solvent, coating the resist composition on a substrate to form a resist layer, performing a soft bake process to evaporate the organic solvent, performing an exposure process and a post-bake process to change a portion of the resist layer into a mask pattern, and performing a development process to remove the resist layer while retaining the mask pattern.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Figure 1:
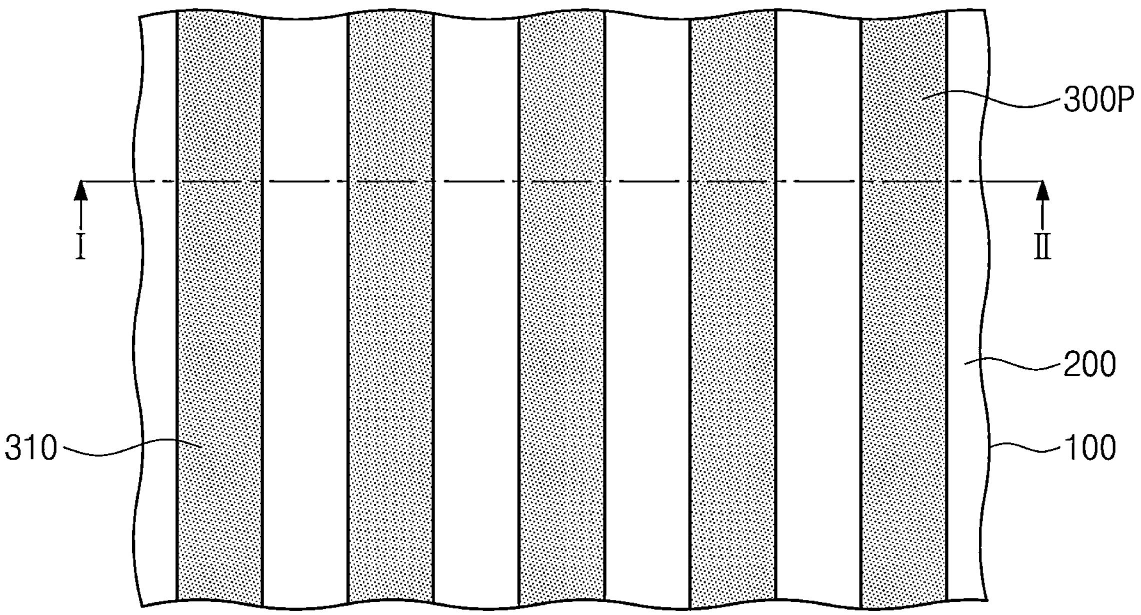
FIG. 1 is a plan view illustrating a resist pattern according to embodiments.

Hereinafter, example embodiments according to the disclosure will be described in detail with reference to the accompanying drawings. In this specification, 'resist' may also be referred to as 'photoresist', 'electron beam resist', or 'extreme ultraviolet resist'.

A resist material according to example embodiments of the disclosure is an organometallic compound comprising a metal combined with at least one ligand containing four or more fluorine atoms and is represented by the following Chemical Formula 1.

(Chemical Formula 1)

$$[(R^1M)_iI_jX_k(OH)_m]\ (OH)_nR^2_p,$$

In Chemical Formula 1, one of "$R^1$" and "$R^2$" is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of "$R^1$" and "$R^2$" is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, "a" is an integer of 1 to 20, "d" and "e" are each independently an integer of 0 to 5, "c" is an integer of 0 to 20, "b" is an integer of 4 to 30, "M" is one metal selected from Sn, Sb, Te, Ir, Ti, Bi, Po, At, In, Ag, Au, Pt, Si, Al, and Ga, "i" is an integer from 1 to 12, "j" is an integer of 1 to 14, "X" is a halogen element selected from I, Cl, F, and Br, "k" is an integer of 0 to 6, "m" is an integer of 0 to 6, "n" is an integer of 0 to 2, and "p" is an integer of 0 to 2. "$R^1$" may be referred to as an organic ligand.

The organometallic compound may be represented by the following Chemical Formula 1-1.

(Chemical Formula 1-1)

$$[(R^1M)_iI_jX_k(OH)_m]_q^+\ (OH^-)_nR^2_p$$

In Chemical Formula 1-1, "q" is an integer of 0 to 2. Other symbols are the same as in Chemical Formula 1.

The organometallic compound as illustrated in Chemical Formula 1-1 may be stabilized by "q" having a cationic form in which organic ligands "$R^1$" are covalently bonded to metal atoms "M", and n $OH^-$ groups or p "$R^2$" having the form of an anion.

In a preferred embodiment, "M" may be tin (Sn), and the organometallic compound may have a structure selected from Chemical Formula 2 to Chemical Formula 5 below.

(Chemical Formula 2)

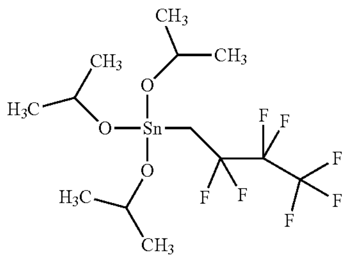

(Chemical Formula 3)

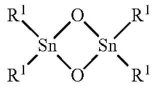

(Chemical Formula 4)

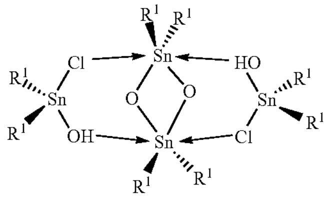

(Chemical Formula 5)

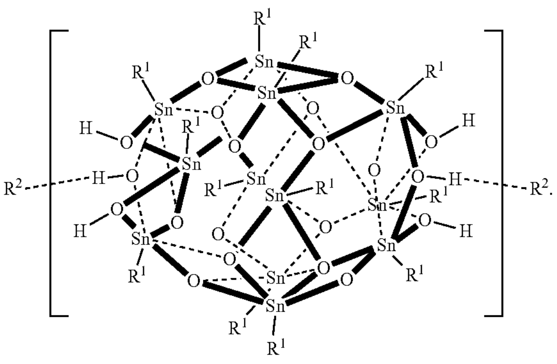

Chemical Formula 5 may be expressed as Chemical Formula 5-1 as follows.

(Chemical Formula 5-1)

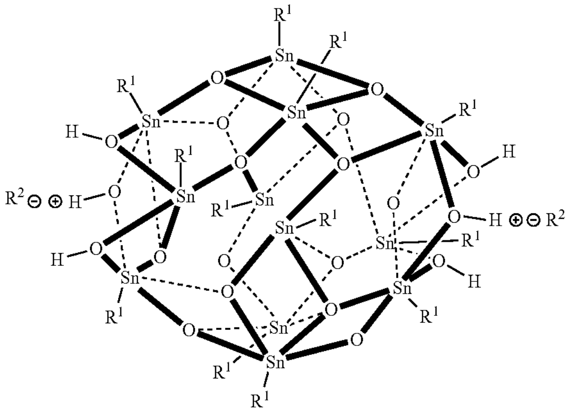

The organometallic compound may have a structure represented by the following Chemical Formula 5-2.

(Chemical Formula 5-2)

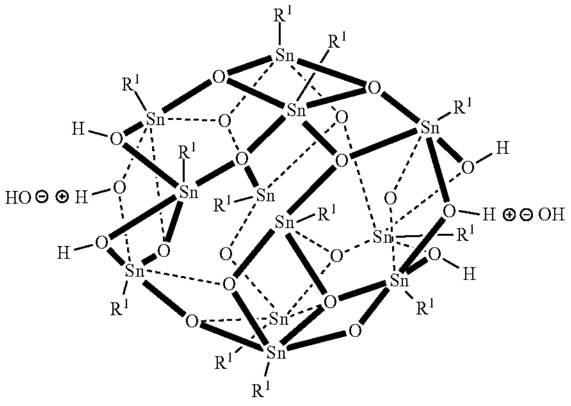

"$R^1$" may preferably have one structure of

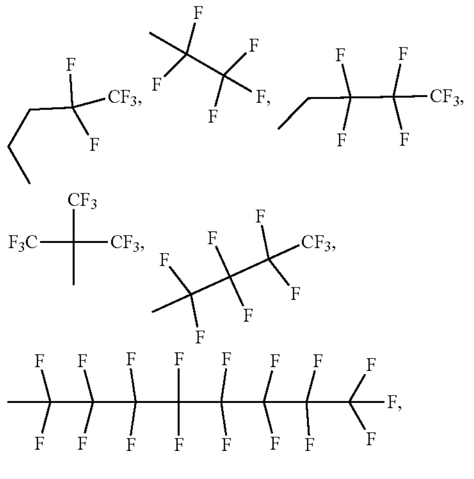

-continued

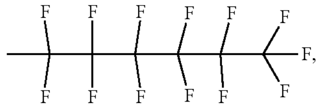

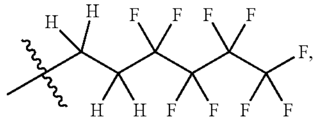

and

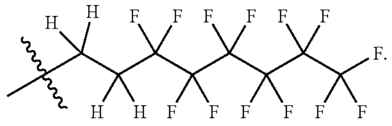

"$R^2$" may preferably have a structure of

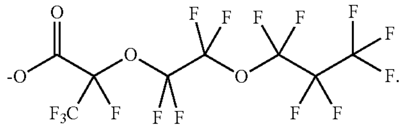

The organometallic compound may have a spherical cage shape as shown in Chemical Formulas 4, 5, 5-1, and 5-2.

The organometallic compound includes a tin oxide nanocluster structure having a spherical cage shape in which oxygen atoms and organic ligands "$R^1$" are covalently combined with 12 tin atoms as shown in Chemical Formula 5-1. The tin oxide nanocluster structure has a divalent cation. The organometallic compound has a structure in which two counter anions are combined with the tin oxide nanocluster structure of divalent cation. As a result, the organometallic compound may be stabilized in an electrically neutral state, generally. The organometallic compound has a smaller particle diameter than that of a polymer resin of a chemically amplified resist (CAR) photoresist (PR) and has a uniform size distribution, and thus it is advantageous in terms of securing resolution and line edge roughness (LER), which are performance indicators of a resist pattern.

The organometallic compound contains four or more fluorine atoms, and thus has very strong hydrophobicity and is resistant to moisture. Accordingly, the resist composition including the organometallic compound may control moisture sensitivity and may have good storage safety. In addition, when the organometallic compound is used as a resist material, process delay (post coating delay [PCD], post exposure delay [PED], post PEB delay [PPD]) may be improved.

When "M" in the organometallic compound is tin, the organometallic compound may have higher absorbance to extreme ultraviolet (EUV) and have excellent etching resistance in an etching process, and thus may be used as an etching mask. The organometallic compound may have a Sn—O—Sn networking structure, and thus may have excellent etching resistance. In the organometallic compound, a radical reaction may occur between the organic ligands "$R^1$" as shown in Scheme 1 in a portion exposed to light such as EUV during an exposure process, thereby crosslinking the organometallic compounds. As a result, the molecular weight of the portion exposed to the light increases.

<Scheme 1>

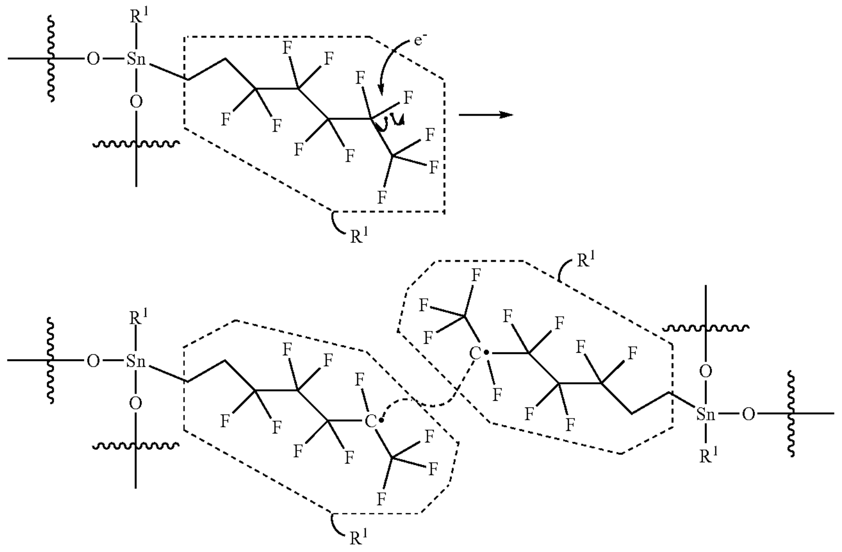

Accordingly, the organometallic compounds are radical bonded and are not dissolved in a development process. A radical reaction may occur even with a small amount of light (a small number of photons), and thus the resist composition according to the disclosure including the organometallic compound as a resist material may have improved photosensitivity.

A polar ultraviolet is ionizing radiation with a wavelength of 13.5 nm, and an energy of one photon in the polar ultraviolet is 14 times greater than that of a deep ultraviolet ArF excimer laser (193 nm). As a result, the number of photons injected into EUV lithography is greatly reduced, which leads to an RLS trade-off dilemma among resolution (R), line edge roughness (LER) and sensitivity (S) of the resist pattern. Therefore, it is necessary to maximally absorb the limited number of photons.

The resist material according to the disclosure is the organometallic compound of Chemical Formula 1, and includes a perfluorinated alkyl chain having excellent absorbance for the extreme ultraviolet, as the organic ligand "$R^1$". The ligand "$R^1$" of the perfluorinated alkyl may form a new cross-linkage between the ligands "$R^1$" because radicals may be formed by high-energy photons in addition to improved absorbance. Thereby, the light sensitivity may be further improved.

In addition, a resist composition according to the disclosure may have improved resolution, mechanical characteristics, and etching resistance.

When the metal "M" is tin, the organometallic compound comprising tin with which ligands including four or more fluorine atoms are combined may also be referred to as a 'fluorinated tin oxide cluster'. The fluorinated tin oxide cluster may be developed using a fluorous liquid having a low surface tension and a supercritical CO2 development process. This may prevent collapse of the resist pattern in the development process, thereby implementing accurate patterning without process defects. The fluorous liquid may have a low surface tension of preferably 30 dynes/cm to 1 dynes/cm, more preferably 20 dynes/cm to 10 dynes/cm.

The method for synthesizing the organometallic compound is as follows. First, through a Grignard reaction, perfluoroalkyl triphenyl tin ($R^1SnPh_3$) containing a perfluorinated alkyl group is prepared (step 1), and is treated with chlorination to synthesize a precursor, perfluoroalkyl tin trichloride ($R^1SnCl_3$) (step 2). Then, the precursor is hydrolyzed under a basic condition to prepare tin-oxo cage (TOC) nanoclusters in a circular cage shape (step 3). Then, a counter anion of the tin oxide nanocluster is substituted with an anion of a highly fluorinated alkyl ether carboxylic acid to prepare the organometallic compound having the structure of Chemical Formula 1 (Step 4).

By replacing the counter anion with the anion of the highly fluorinated alkyl ether carboxylic acid, the solubility of the organometallic compound in the fluorous liquid may be increased. Accordingly, when the resist composition is prepared using the organometallic compound and a resist layer is prepared by spin coating, the resist layer with a thin thickness may be fabricated without defects.

The resist composition according to the disclosure includes the organometallic compound and an organic solvent. The organometallic compound may be included in an amount of 1 to 30 wt. % based on the total weight of the resist composition. The organic solvent may be included in an amount of 70 to 99 wt. % based on the total weight of the resist composition.

Preferably, the organic solvent may be at least one of propylene glycol monomethyl ether (PGME), propylene glycol monomethyl ether acetate, 2-hydroxyisobutyric acid methyl ester (HBM), ethyl lactate, cyclohexanone, heptanone, lactone, or a fluorine-containing material. As another preferable embodiment, the organic solvent may be at least one of methyl isobutyl carbinol (MIBC), ether, propylene glycol monomethyl ether acetate (PGMEA), propylene glycol monomethyl ether (PGME), ethyl lactate (EL), β-hydroxy β-methylbutyric acid (HBM) or a fluorine-containing material.

In an example, the resist composition may further include a photo acid generator in an amount of 0 to 10 wt. % based on the total weight of the resist composition. The photo acid generator is a substance that is decomposed by light to generate a strong acid. The generated strong acid may act as a catalyst to control the degree of combination between the organometallic compounds. The photo acid generator is preferably at least one of aryldiazonium, diaryliodonium, triarylsulfonium, triarylphosphonium salts, carboxylic acids, sulfonic acids, phosphoric acids, and hydrogen halides.

In an example, the resist composition may further include at least one of a radical quencher, a photolysis quencher, and a base quencher, in an amount of 0 to 10 wt. % based on the total weight of the resist composition. The radical quencher, photolysis quencher, and/or base quencher, which are substances that cause quenching during the exposure process, may serve to suppress or control hydrogen ions in the resist layer formed of the resist composition. The radical quencher, photolysis quencher, and/or base quencher preferably may be at least one of hydrogen chloride, ethyl ester, alcohol, water, a fluorine compound, cyanide, ketone, bromide, oxide, amines, aldehyde, phenol, a nitro compound, and a triarylsulfonium salt.

In an example, the resist composition may further include a thermal acid generator in an amount of 0 to 10 wt. % based on the total weight of the resist composition. The thermal acid generator is a substance that is decomposed by heat to generate a strong acid.

In an example, the resist composition may further include a surfactant in an amount of 0 to 10 wt. % based on the total weight of the resist composition. A commercially available surfactant such as a surfactant from the Sulfinol series by Air Products or the F-series (F-410, F-444, F-477, R-08, R-30) by DIC Corporation (Dainippon Ink Chemical Industry Co., Ltd.) may be used as the surfactant.

The resist composition may further include at least one of a crosslinking agent, a leveling agent, an antioxidant, and an adhesion improving agent. The resist composition according to the disclosure may preferably be a negative resist.

A method of fabricating a semiconductor device according to the disclosure includes preparing a resist composition including an organometallic compound and an organic solvent; forming a resist layer by coating the resist composition on a substrate; performing a soft bake process to evaporate the organic solvent; performing an exposure process to change a portion of the resist layer into a mask pattern; and performing a development process to remove the resist layer while retaining the mask pattern.

FIG. 1 is a plan view illustrating a resist pattern according to embodiments. FIGS. 2 to 5 are diagrams for explaining a method of fabricating a semiconductor device according to embodiments.

Figure 2:
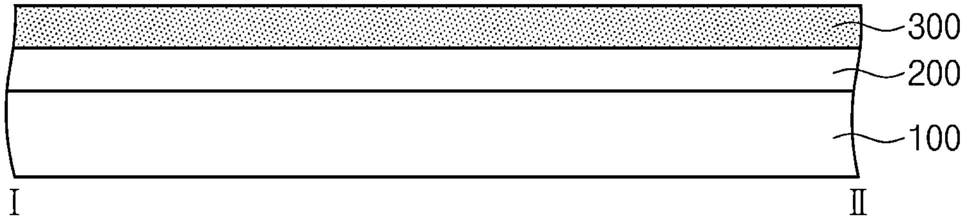
FIGS. 2 to 5 are diagrams for explaining a method of fabricating a semiconductor device according to embodiments.

Referring to FIGS. 1 and 2, a substrate 100 may be prepared. A lower layer 200 and a resist layer 300 may be sequentially formed on the substrate 100. The lower layer 200 may be an etch target layer. The lower layer 200 may be formed of any one selected from a semiconductor material, a conductive material, and an insulating material, or a combination thereof. In addition, the lower layer 200 may be formed as a single layer or may be a plurality of stacked layers. Additional layers may be provided between the substrate 100 and the lower layer 200.

A resist composition may be applied on the lower layer 200 to form the resist layer 300. The application of the resist composition may be performed by spin coating. A soft bake process may be further performed on the resist composition. The soft bake process may be performed at about 80° C. to 200° C. Accordingly, the organic solvent included in the resist layer 300 may be evaporated. 'Bake' may be called 'heating'. The soft bake process may be omitted.

Figure 3:
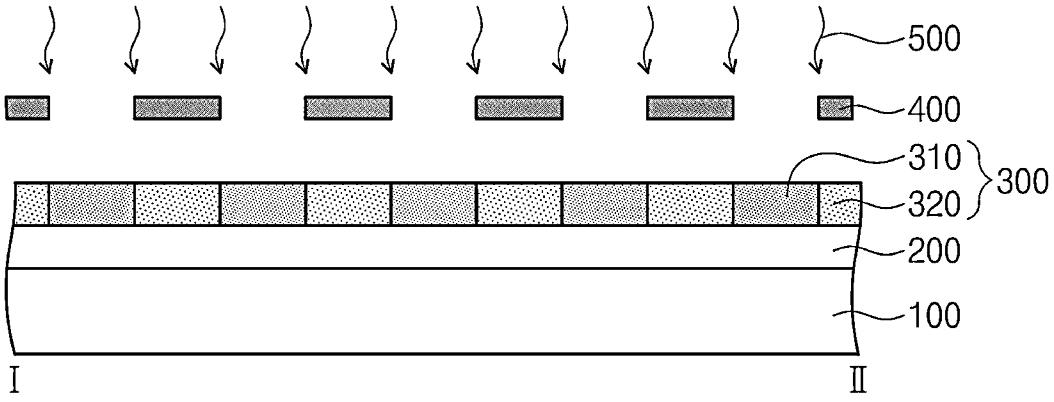

Referring to FIGS. 1 and 3, the resist layer 300 may be exposed by a light 500. The light 500 may be an electron beam or extreme ultraviolet. Before the light 500 is irradiated, a photomask 400 may be disposed on the resist layer 300. The light 500 may be irradiated onto a first portion 310 of the resist layer 300 exposed by the photomask 400. When the resist layer 300 is exposed to the light 500, a radical reaction may occur as shown in Scheme 1, and radical bonding between the organometallic compounds of Chemical Formula 1 may occur. Accordingly, a chemical structure of the first portion 310 of the resist layer 300 exposed to the light 500 may be changed.

A second portion 320 of the resist layer 300 may not be exposed to the light 500. A chemical structure of the second portion 320 of the resist layer 300 may not be changed. Accordingly, after the light 500 is irradiated, the first portion 310 of the resist layer 300 may have a different chemical structure from that of the second portion 320. Thereafter, the photomask 400 may be removed.

A post-baking process may be performed after the exposure process. The post-bake process (or post-exposure bake process) may be omitted.

Figure 4:
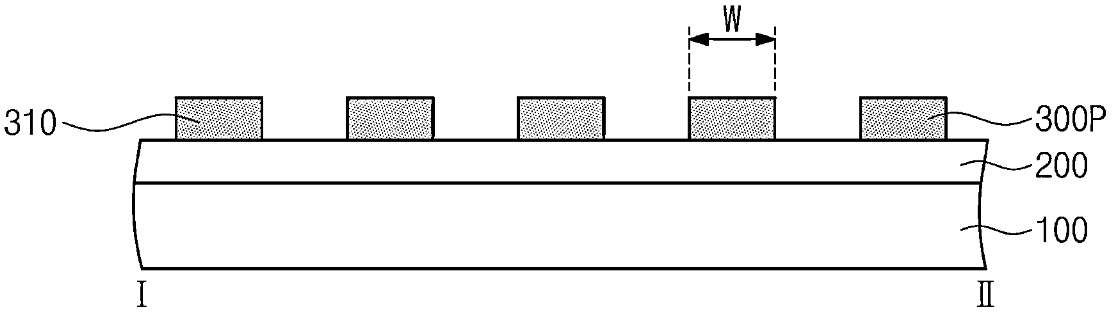

Referring to FIGS. 1 and 4, the second portion 320 of the resist layer 300 may be removed by a developer to form a resist pattern 300P. The photoresist pattern 300P may be formed by a patterning process including exposure and development of the resist layer 300. The resist pattern 300P may correspond to the first portion 310 of the resist layer 300. The developer may include a high fluorous solution. The high fluorous solution may mean a solution having a high fluorine content. For example, the developer may include at least one of hydrofluoroether (HFE) and perfluorocarbon (PFC). When the high fluorous solution is used as the developer, the developer may have a low surface tension. Accordingly, pattern collapse of the resist pattern 300P may be prevented in the development process. The development process of the resist pattern 300P may be chemically stable. Accordingly, the resist pattern 300P may be formed with a fine width "W" and a pitch.

The second portion 320 of the resist layer 300 may have high solubility in the developer. As the resist compound has a relatively narrow polydispersity index, the second portion 320 of the resist layer 300 may be uniformly dissolved in the developer. Accordingly, the resist pattern 300P formed from the resist compound may have a narrow width.

As shown in FIG. 1, the resist pattern 300P may have a linear planar shape. For example, the resist pattern 300P may include portions extending in one direction. However, the planar shape of the resist pattern 300P may be modified to another shape, such as a zigzag shape, a honeycomb shape, or a circular shape. The resist pattern 300P may expose the lower layer 200.

Figure 5:
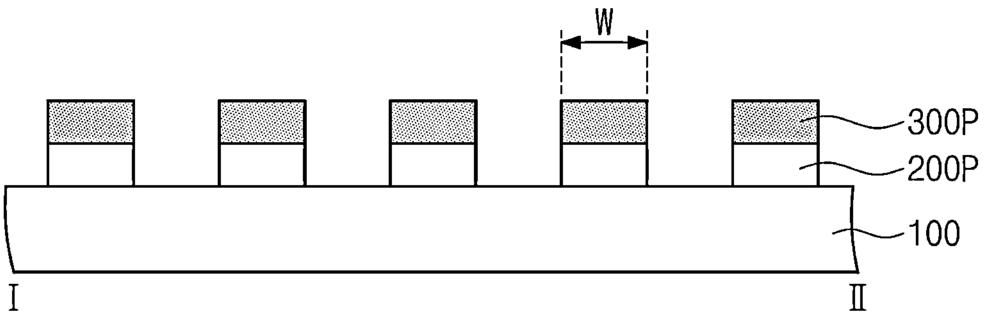

Referring to FIGS. 1 and 5, the lower layer 200 exposed by the resist pattern 300P may be removed to form a lower pattern 200P. The lower layer 200 may be removed by an etching process. The lower layer 200 may have etch selectivity with respect to the resist pattern 300P. The lower pattern 200P may expose the substrate 100. As another example, the lower pattern 200P may expose another layer interposed between the substrate 100 and the lower pattern 200P.

The resist pattern 300P may have strong etching resistance, and thus a shape of the resist pattern 300P may be maintained during the etching process of the lower layer 200. Thereafter, the resist pattern 300P may be removed. The lower pattern 200P may be a gate line or a wiring line of a semiconductor device. Alternatively, the lower pattern 200P may be a mask pattern in a semiconductor device fabricating process.

Hereinafter, embodiments of the disclosure will be described in detail.

<Example 1> Synthesis of Perfluorinated Octyl Triphenyl Tin ($R^1SnPh_3$-6) in which a Perfluorinated Octyl Chain is Substituted A first solution was prepared by adding magnesium turnings (1.06 g, 43.6 mmol) and diethyl ether (25 $cm^3$) into a 250 $cm^3$ one-necked round flask at 0° C. After preparing a second solution in which 1H,1H,2H,2H-tridecafluoro-n-octyl iodide (18.6 g, 39.3 mmol) was dissolved in diethyl ether (50 $cm^3$), the second solution was dropped in the first solution cooled with a cooling water bath. After removing the cooling water bath and stirring a third solution formed by a reaction of the first solution and the second solution at room temperature for 3 hours, a fourth solution prepared by dissolving triphenyl tin chloride (5.6 g, 14.53 mmol) in tetrahydrofuran (THF, 25 $cm^3$) was added to the third solution. The fourth solution and the third solution were reacted at room temperature for 24 hours to prepare a fifth solution, and purified water (60 $cm^3$) was added to terminate the reaction. After filtering the fifth solution through Celite, a product was extracted from the fifth solution with hexane, and the product was washed with water and a saturated aqueous sodium chloride solution. Anhydrous $MgSO_4$ was added to an organic liquid separated from the fifth solution, followed by stirring to remove moisture in the product. After filtration, the organic liquid obtained by concentration under reduced pressure was purified through column chromatography (silica gel, hexane), and thus a white solid, triphenyl (3,3,4,4,5,5,6,6,7,7,8,8,8-tridecafluorooctyl)stannane ($R_1SnPh_3$-6) was obtained (6.73 g, yield: 67%).

$^1H$ NMR (400 MHz, acetone, ppm): δ=7.37-7.71 (m, 10H), 2.24-2.49 (t+q, 2H, J=16, 20 MHz), 1.74 (t, 2H, J=8 Hz))

Perfluorinated octyl triphenyl tin ($R_1SnPh_3$-6) may be synthesized through a Grignard reaction.

A chemical reaction according to Example 1 is shown in Scheme 2 below.

(Scheme 2)

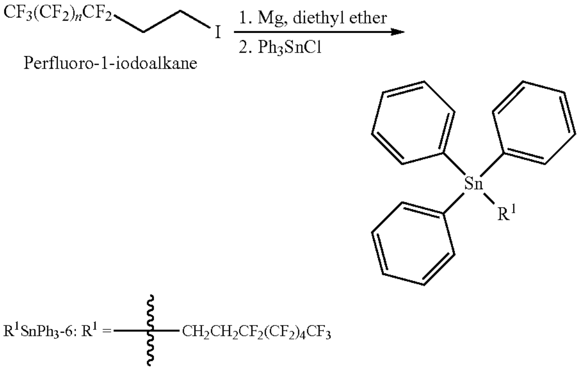

Perfluoro-1-iodoalkane

Perfluorinated octyl triphenyl tin ($R^1SnPh_3$-6) or triphenyl(3,3,4,4,5,5,6,6,7,7,8,8,8-tridecafluorooctyl)stannane synthesized according to Example 1 has a structure as shown in Chemical Formula 6 below.

(Chemical Formula 6)

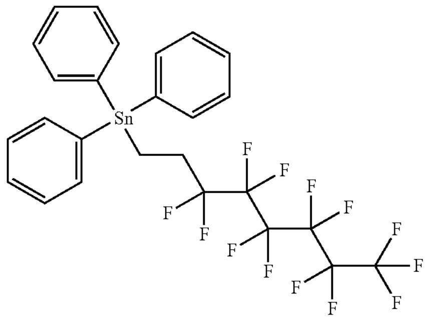

Figure 6:
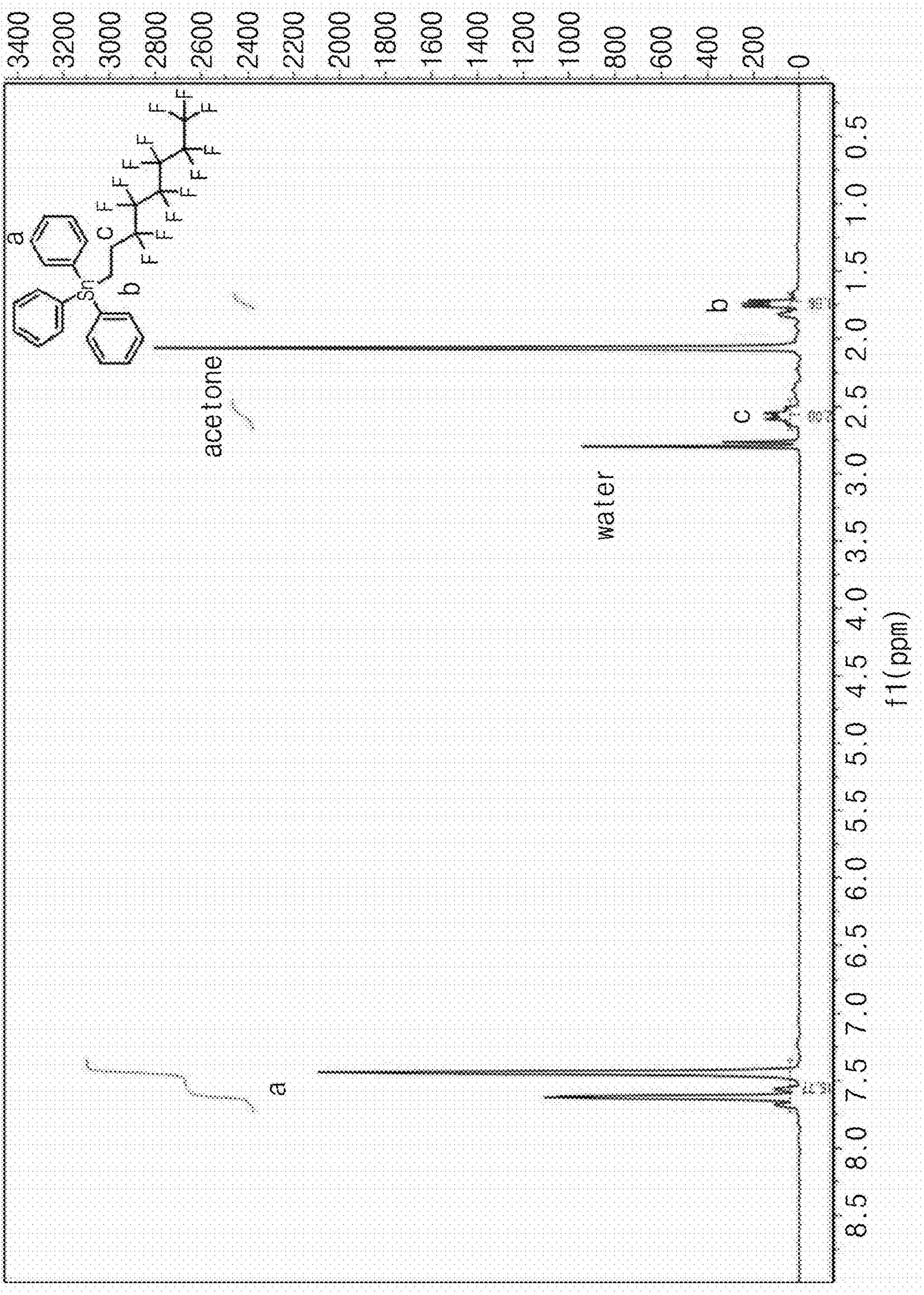
FIG. 6 is a view illustrating an NMR graph of perfluorinated octyl triphenyl tin ($R_1SnPh_3$-6) synthesized according to Example 1.

FIG. 6 is a view illustrating an NMR graph of perfluorinated octyl triphenyl tin ($R^1SnPh_3$-6) synthesized according to Example 1. Referring to FIG. 6, it may be seen that perfluorinated octyl triphenyl tin ($R^1SnPh_3$-6) is synthesized.

<Example 2> Synthesis of Perfluorinated Hexyl Triphenyl Tin ($R^1SnPh_3$-4) in which the Perfluorinated Hexyl Chain is Substituted A first solution was prepared by adding magnesium turnings (0.63 g, 25.9 mmol), 1H,1H,2H,2H-nonafluorohexyl iodide (8.73 g, 23.4 mmol), and diethyl ether (40 $cm^3$) into a 250 $cm^3$ one-necked round flask at 0° C. After stirring the first solution at room temperature for 3 hours, a second solution prepared by dissolving triphenyl tin chloride (5.0 g, 12.97 mmol) in THF (20 $cm^3$) was added to the first solution. After the first solution and the second solution were reacted at room temperature for 24 hours to prepare a third solution, and purified water (60 $cm^3$) was added to terminate the reaction. After filtering the third solution through Celite, a product was extracted from the third solution with hexane (60 $cm^3$), and the product was washed with water and a saturated aqueous sodium chloride solution. Anhydrous $MgSO_4$ was added to an organic liquid separated from the third solution, followed by stirring to remove moisture in the product. After filtration, the organic liquid obtained by concentration under reduced pressure was purified through chromatography (silica gel, hexane), and a white solid, triphenyl(3,3,4,4,5,5,6,6,6-nonafluorohexyl)stannane ($R^1SnPh_3$-4, 6.0 g yield: 71%) was obtained.

$^1H$ NMR (400 MHz, CDCl3, ppm): δ=7.35-7.60 (m, 15H), 2.25-2.44 (t+q, 2H, J=16.4 Hz, 17.2 Hz), 1.50-1.69 (t+q, 2H), J=17.6 Hz, 19.6 Hz)

Perfluorinated hexyl triphenyl tin ($R^1SnPh_3$-4) may be synthesized through a Grignard reaction.

A chemical reaction according to Example 2 is shown in Scheme 3 below.

(Scheme 3)

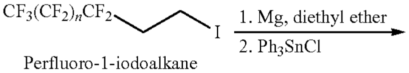

Perfluoro-1-iodoalkane

-continued

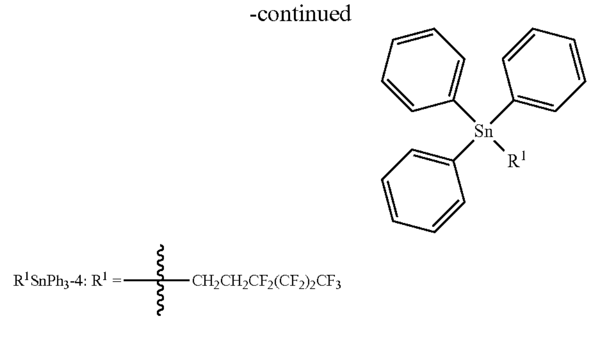

Perfluorinated hexyl triphenyl tin ($R_1SnPh_3$-4) or triphenyl(3,3,4,4,5,5,6,6,6-nonafluorohexyl)stannane synthesized according to Example 2 has a structure as shown in Chemical Formula 7 below.

(Chemical Formula 7)

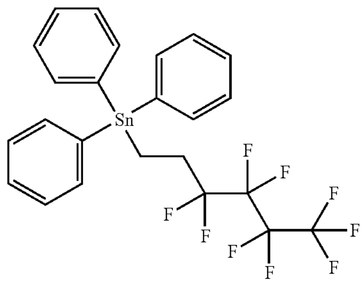

Figure 7:
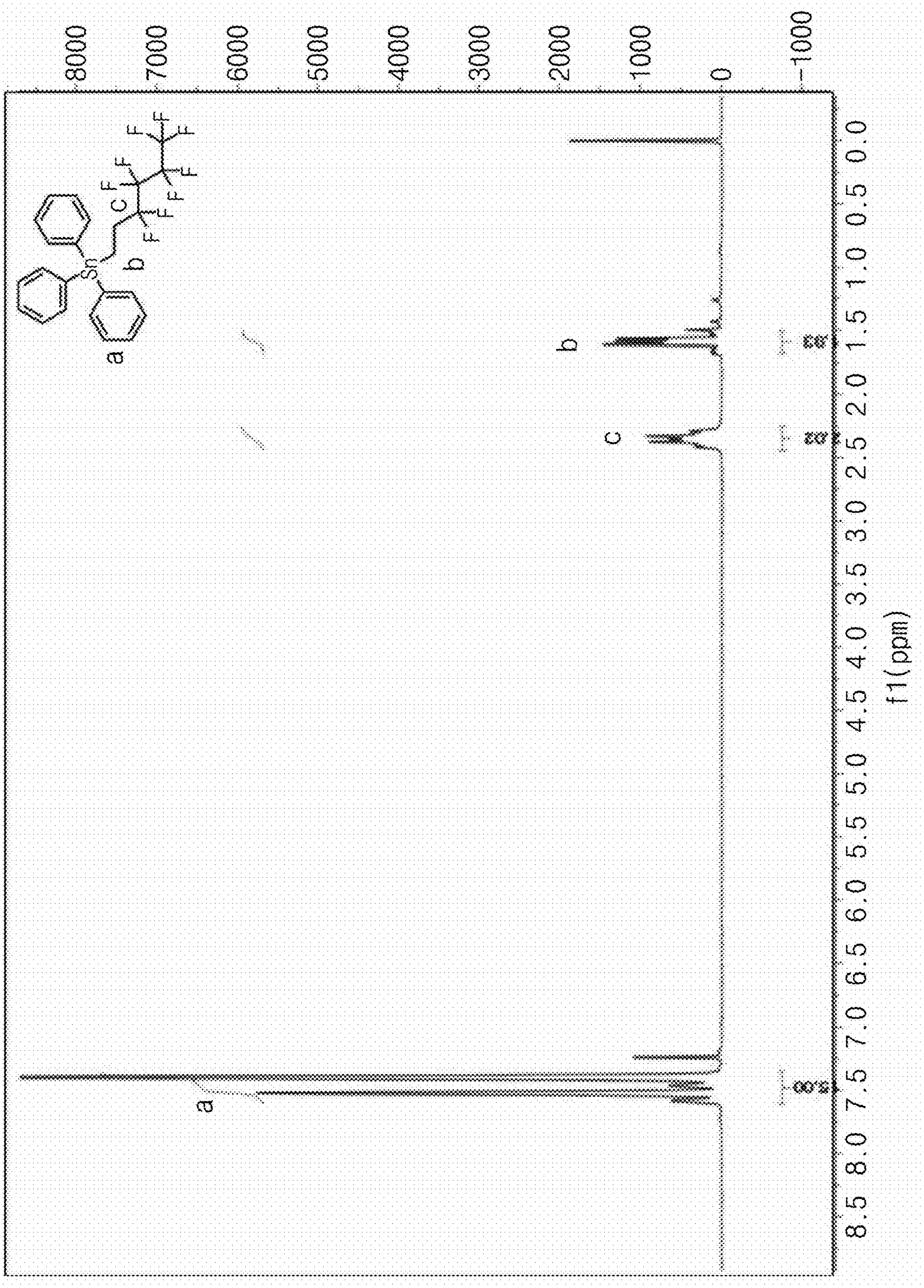
FIG. 7 is a view illustrating an NMR graph of perfluorinated hexyl triphenyl tin ($R_1SnPh_3$-4) synthesized according to Example 2.

FIG. 7 is a view illustrating an NMR graph of perfluorinated hexyl triphenyl tin ($R^1SnPh_3$-4) synthesized according to Example 2. Referring to FIG. 7, it may be seen that perfluorinated hexyl triphenyl tin ($R_1SnPh_3$-4) is synthesized.

<Example 3> Synthesis of Perfluorinated Octyl Tin Trichloride ($R^1SnCl_3$-6) in which a Perfluorinated Octyl Chain is Substituted A precursor, $R^1SnCl_3$-6, was synthesized by chlorination of $R^1SnPh_3$-6 of Example 1. In detail, $R_1SnPh_3$-6 (3.83 g, 5.50 mmol) of Example 1 and dichloromethane (DCM, 15 $cm^3$) were added and stirred in a 250 $cm^3$ one-necked round flask to prepare a first solution, and the first solution was cooled to 0° C. A second solution (2M concentration, 16.5 $cm^3$, 33.0 mmol) of HCl dissolved in diethyl ether was added dropwise to the cooled first solution for 30 minutes, and then a reactant was stirred at room temperature for 12 hours. After evaporating a solvent from the reactant under reduced pressure, the reactant was purified using Kugelrohr distillation, and thus a transparent liquid, trichloro(3,3,4,4,5,5,6,6,7,7,8,8,8-tridecafluorooctyl)stannane ($R^1SnCl_3$-6) was obtained (1.45 g, yield: 46%).

$^1H$ NMR (400 MHz, CDCl3, ppm): δ=2.69 (sep, 2H, J=8 Hz), 2.37 (t, 2H, J=8 Hz)

A chemical reaction according to Example 3 is shown in Scheme 4 below.

(Scheme 4)

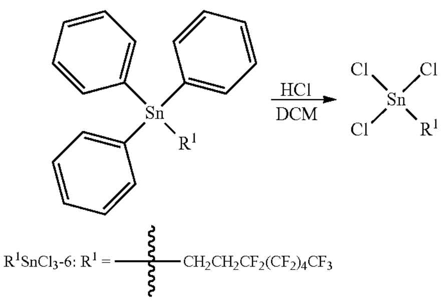

Perfluorinated octyl tin trichloride ($R^1SnCl_3$-6) or trichloro(3,3,4,4,5,5,6,6,7,7,8,8,8-tridecafluorooctyl)stannane synthesized according to Example 3 has a structure as shown in Chemical Formula 8 below.

(Chemical Formula 8)

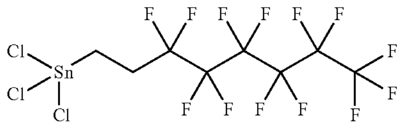

Figure 8:
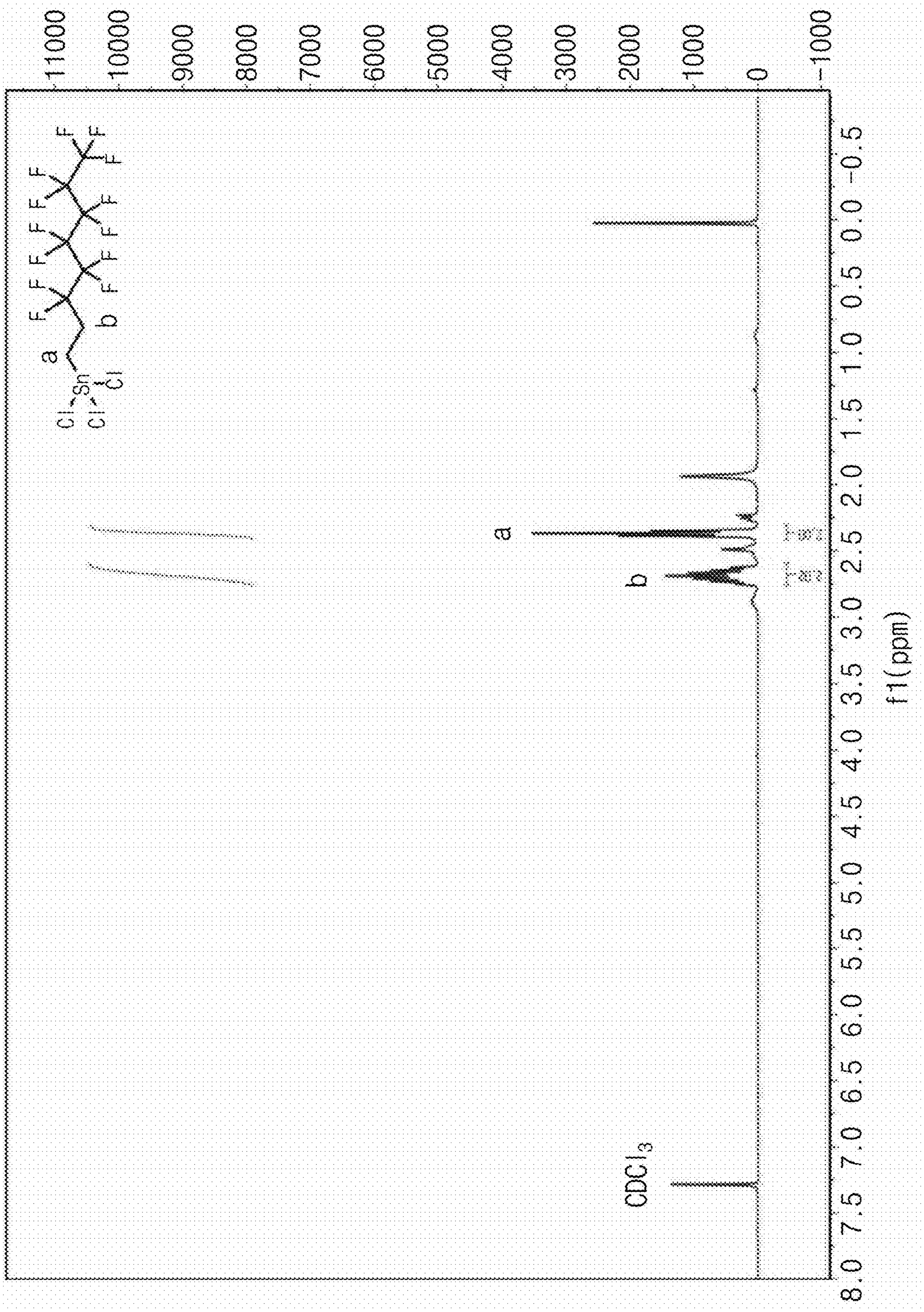
FIG. 8 is a view illustrating an NMR graph of perfluorinated octyl tin trichloride ($R^1SnCl_3$-6) synthesized according to Example 3.

FIG. 8 is a view illustrating an NMR graph of perfluorinated octyl tin trichloride ($R^1SnCl_3$-6) synthesized according to Example 3. Referring to FIG. 8, it may be seen that perfluorinated octyl tin trichloride ($R^1SnCl_3$-6) is synthesized.

<Example 4> Synthesis of Perfluorinated Hexyl Tin Trichloride ($R^1SnCl_3$-4) in which the Perfluorinated Hexyl Chain is Substituted A precursor ($R^1SnCl_3$-4) was synthesized by chlorination of $R_1SnPh_3$-4 of Example 2.

$R^1SnPh_3$-4 (5.5 g, 9.22 mmol) and dichloromethane (DCM, 20 $cm^3$) of Example 2 were added into a 100 $cm^3$ one-necked round flask, and then cooled to 0° C. to prepare a first solution. Thereafter, a second solution (2M concentration, 27.7 $cm^3$, 55.4 mmol) of HCl dissolved in diethyl ether was added dropwise to the first solution over 30 minutes. A reactant was stirred at 35° C. for 12 hours, and then was concentrated under reduced pressure. This was distilled at 200° C. under reduced pressure, and a pale yellow liquid, trichloro(3,3,4,4,5,5,6,6,6-nonafluorohexyl)stannane ($R^1SnCl_3$-4) was obtained (2.8 g, yield: 64%).

$^1H$ NMR (400 MHz, CDCl3, ppm): δ=2.55-2.73 (m, 2H), 2.25-2.36 (t, 2H, J=8 Hz)

A chemical reaction according to Example 4 is shown in Scheme 5 below.

(Scheme 5)

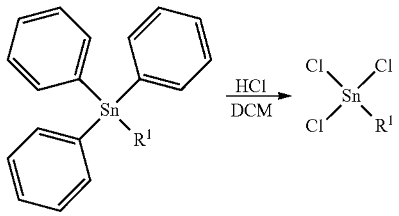

-continued $R^1SnCl_3$-4: $R^1$ = 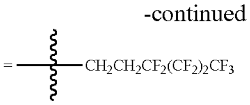

Perfluorinated hexyl tin trichloride ($R^1SnCl_3$-4) or trichloro(3,3,4,4,5,5,6,6,6-nonafluorohexyl)stannane synthesized according to Example 4 has a structure as shown in Chemical Formula 9 below.

(Chemical Formula 9)

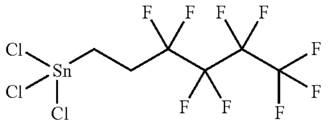

Figure 9:
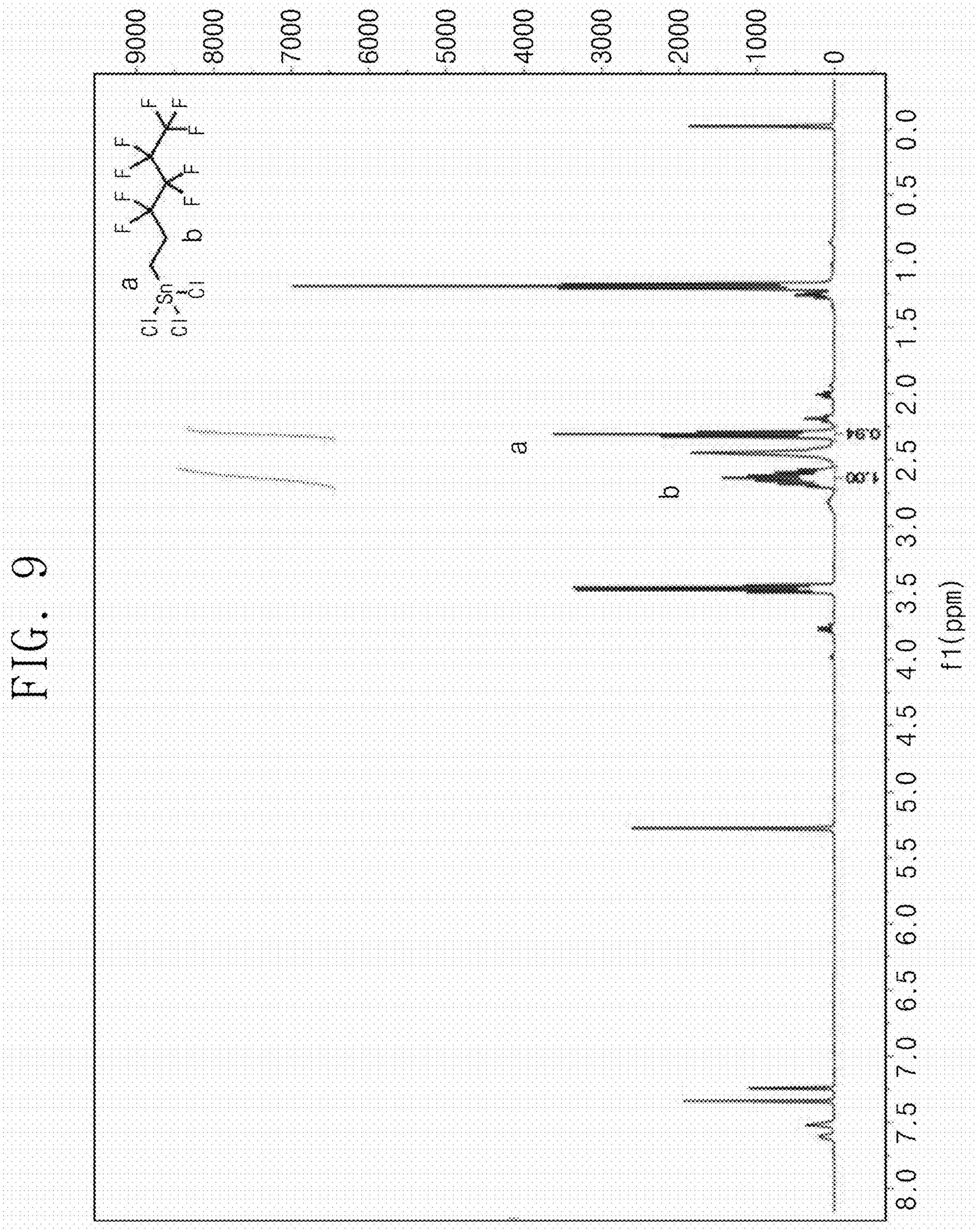
FIG. 9 is a view illustrating an NMR graph of perfluorinated hexyl tin trichloride ($R^1SnCl_3$-4) synthesized according to Example 4.

FIG. 9 is a view illustrating an NMR graph of perfluorinated hexyl tin trichloride ($R^1SnCl_3$-4) synthesized according to Example 4. Referring to FIG. 9, it may be seen that perfluorinated hexyl tin trichloride ($R^1SnCl_3$-4) is synthesized.

<Example 5> Synthesis of Tin-Oxo Cage $[(R^1Sn)_{12}O_{14}(OH)_6]^{2+}(OH^-)_2$ (TOC-6) in which Perfluorinated Alkyl Chains are Substituted $R^1SnCl_3$-6 of Example 3 was hydrolyzed under a basic condition to prepare tin-oxo cage (TOC) nanoclusters.

$R^1SnCl_3$-6 (2.3 g, 4.02 mmol) of Example 3 was added into a 50 $cm^3$ vial, and 0.5 M aqueous solution of tetramethylammonium hydroxide (TMAH) (24 $cm^3$) was added with vigorous stirring. The resulting mixture was stirred at room temperature for 1 hour, and then a solid was obtained through a filter. The obtained solid was then washed several times with purified water and dried, and thus a white solid, $[(R^1Sn)_{12}O_{14}(OH)_6]^{2+}(OH^-)_2$ (hereinafter referred to as TOC-6) was synthesized (2.09 g, yield: 90%).

$^1$H NMR (400 MHz, acetone, ppm): δ=2.34-2.84 (br, 2H), 0.78-1.57 (br, 2H) IR [(KBR): v_max, (cm^(−1))] 1242, 1209, 1142, 734. 702, 656, 559, 518 m/z (MALDI-TOF) 5964.518 [Exact mass: 5962.90 for $C_{96}H_{56}F_{156}O_{22}Sn_{12}$]

A chemical reaction according to Example 5 is shown in Scheme 6 below (Scheme 6)

$R^1SnCl_3$ 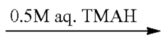

Perfluoroalkyltin triclhoride $[(R^1Sn)_{12}O_{14}(OH)_6]^{2+}(OH^-)_2$

Perfluoroalkylated tin oxo cage (TOC-6)

TOC-6: $R^1$ = 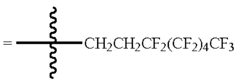

TOC-6 has a structure of Chemical Formula 5-2, wherein "$R^1$" is as described in Scheme 6.

Figure 10:
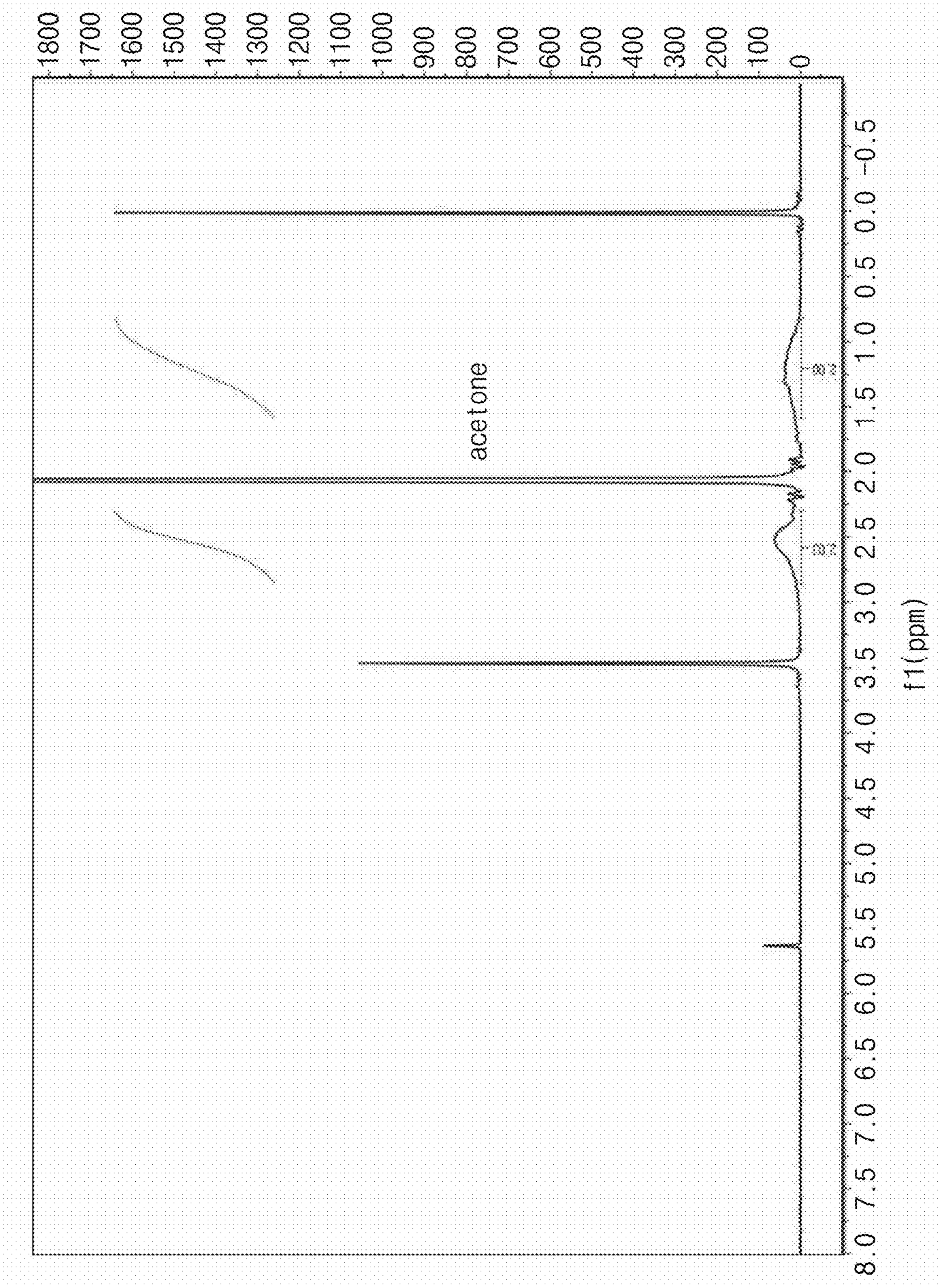
FIG. 10 is an NMR graph of a tin-oxo cage $[(R^1Sn)_{12}O_{14}(OH)_6]^{2+}(OH^-)_2$ (TOC-6) substituted with a perfluorinated alkyl chain synthesized according to Example 5.

FIG. 10 is an NMR graph of a tin-oxo cage $[(R^1Sn)_{12}O_{14}(OH)_6]^{2+}(OH^-)_2$ (TOC-6) substituted with a perfluorinated alkyl chain synthesized according to Example 5. Referring to FIG. 10, it may be seen that $[(R^1Sn)_{12}O_{14}(OH)_6]^{2+}(OH^-)_2$ (TOC-6) is synthesized.

<Example 6> Synthesis of Tin-Oxo Cage $[(R^1Sn)_{12}O_{14}(OH)_6]^{2+}(OH^-)_2$ (TOC-4) in which Perfluorinated Alkyl Chains are Substituted $R^1SnCl_3$-4 of Example 4 was hydrolyzed under a basic condition to prepare tin-oxo cage (TOC) nanoclusters.

After dissolving tetramethylammonium hydroxide pentahydrate (TMAH, 3.22 g, 17.8 mmol) in purified water (35.5 $cm^3$) in a 50 $cm^3$ vial, $R^1SnCl_3$-4 (2.5 g, 5.29 mmol) of Example 4 was quickly added. The reaction solution was stirred vigorously at room temperature for 1 hour, and then an obtained product was filtered. The solid was washed with purified water several times and then dried under vacuum, and a white solid, $[(R^1Sn)_{12}O_{14}(OH)_6]^{2+}(OH^-)_2$ (hereinafter referred to as TOC-4) was obtained (1.6 g, yield: 64%).

$^1$H NMR (400 MHz, (CD3)CO, ppm): δ=2.29-2.90 (br, 24H), 0.84-1.52 (br, 24H)

IR [(KBr): v_max, (cm^(−1))] 3355, 2938, 1491, 1447, 1346, 1224, 1134, 1063, 1010, 881, 839, 731, 572, 520

A chemical reaction according to Example 6 is shown in Scheme 7 below.

(Scheme 7)

$R^1SnCl_3$ 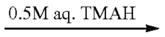

Perfluoroalkyltin triclhoride $[(R^1Sn)_{12}O_{14}(OH)_6]^{2+}(OH^-)_2$

Perfluoroalkylated tin oxo cage (TOC-4)

TOC-4: $R^1$ = 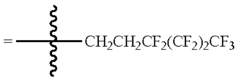

TOC-4 has the structure of Chemical Formula 5-2, wherein "$R^1$" is as described in Scheme 7.

Figure 11:
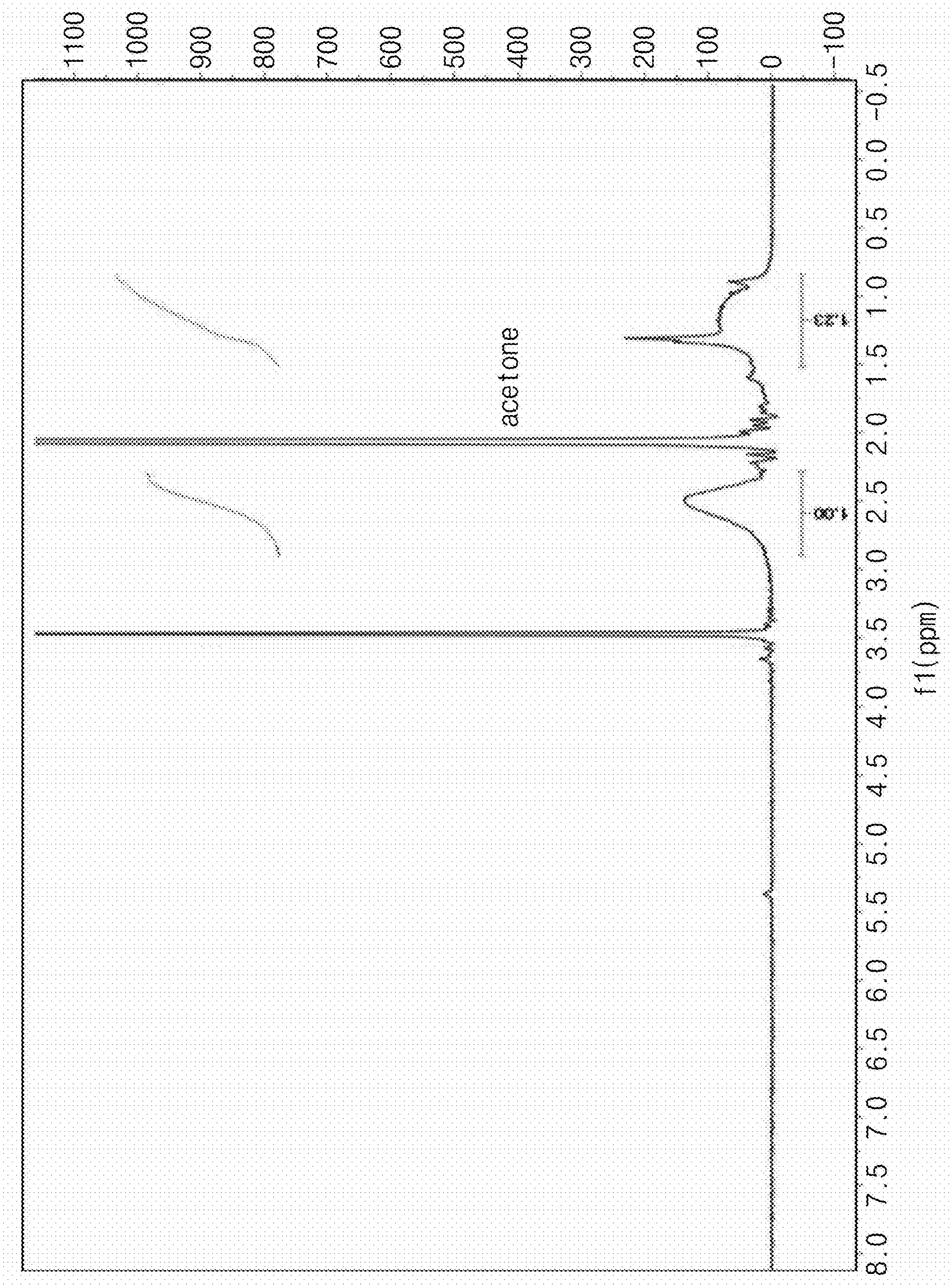
FIG. 11 is an NMR graph of a tin-oxo cage $[(R^1Sn)_{12}O_{14}(OH)_6]^{2+}(OH^-)_2$ (TOC-4) substituted with a perfluorinated alkyl chain synthesized according to Example 6.

FIG. 11 is an NMR graph of a tin-oxo cage $[(R^1Sn)_{12}O_{14}(OH)_6]^{2+}(OH^-)_2$ (TOC-4) substituted with a perfluorinated alkyl chain synthesized according to Example 6. Referring to FIG. 11, it may be seen that $[(R^1Sn)_{12}O_{14}(OH)_6]^{2+}(OH^-)_2$ (TOC-4) is synthesized.

<Example 7> Synthesis of Tin-Oxo Cage $[(R^1Sn)_{12}O_{14}(OH)_6]^{2+}(CF_3(CF_2)_2O(CF_3)CFCF_2O(CF_3)CFCOO^-)_2$ (N-TOC-6) in which a Counter Ion Exchange is Substituted with an Anion of Perfluorinated Alkyl Carboxylic Acid After adding TOC-6 (1 g, 0.16 mmol) and tetrahydrofuran (THF, 4 $cm^3$) of Example 5 into a 50 $cm^3$ vial and stirring, perfluoro(2,5-dimethyl-3,6-dioxanonaic)acid (0.16 g, 0.33 mmol) was added. The resulting mixture was stirred at 50° C. for 30 minutes, and then a reactant was concentrated under reduced pressure to obtain a product in a form of a viscous liquid. Thereafter, a precipitation process of dissolving the product in trifluorotoluene (3 $cm^3$) and dropping the product into toluene was repeated twice, and a solid precipitate was obtained and dried, and thus a white solid, $CF_3(CF_2)_2O(CF_3)CFCF_2O(CF_3)CFCOO^-)_2$ (hereinafter referred to as N-TOC-6) was obtained (0.488 g, yield: 48%).

IR [(KBR): v_max, (cm^(−1))] 1667, 1242, 1209, 1142, 734.702, 656, 559, 518

A chemical reaction according to Example 7 is shown in Scheme 8 below.

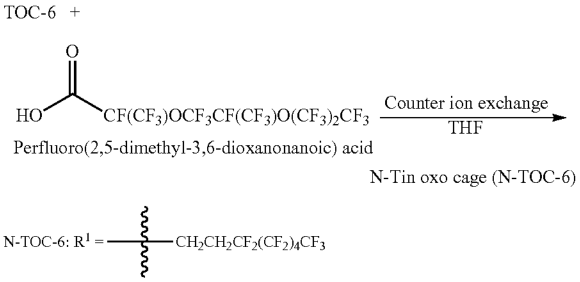

N-TOC-6 has a structure of Chemical Formula 5-1 in which two anions (OH—) in TOC-6 of Chemical Formula 5-2 are substituted with "$R^2$" groups. The "$R^2$" group may be an anion of perfluorinated alkyl carboxylic acid. In N-TOC-6, "$R^1$" is as shown in Scheme 8.

Figure 12:
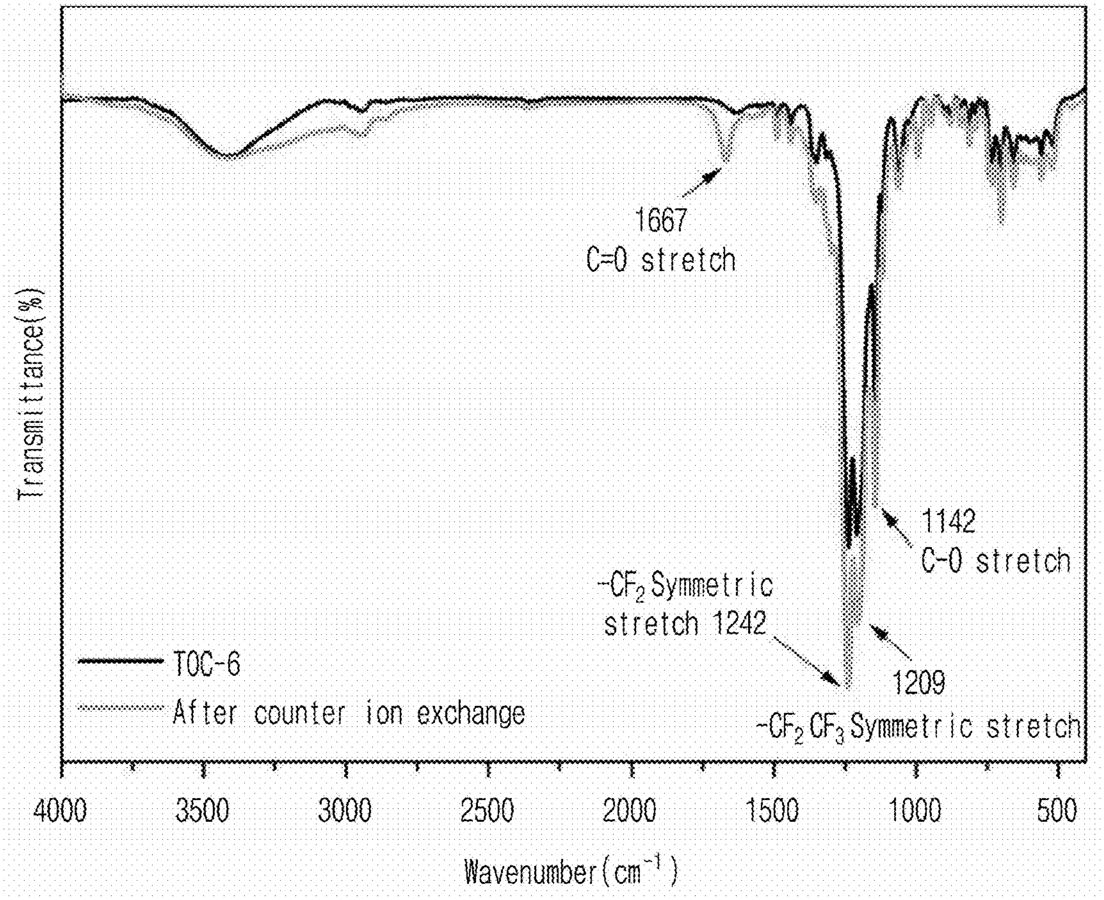
FIG. 12 is a view illustrating a FTIR spectrum before and after a process of preparing N-TOC-6 through a counter ion exchange reaction of tin oxide $[(R^1Sn)_{12}O_{14}(OH)_6]^{2+}(OH^-)_2$ (TOC-6) having a perfluorinated octyl chain (Example 7)

FIG. 12 is a view illustrating a FTIR spectrum before and after a process of preparing N-TOC-6 through a counter ion exchange reaction of tin oxide $[(R^1Sn)_{12}O_{14}(OH)_6]^{2+}(OH^-)_2$ (TOC-6) having a perfluorinated octyl chain (Example 7). Referring to FIG. 12, it may be seen that N-TOC-6 is synthesized.

<Example 8> Synthesis of Tin-Oxo Cage $[(R^1Sn)_{12}O_{14}(OH)_6]^{2+}(CF_3(CF_2)_2O(CF_3)$ $CFCF_2O(CF_3)CFCOO^-)_2$ (N-TOC-4) in which a Counter Ion Exchange is Substituted with an Anion of Perfluorinated Alkyl Carboxylic Acid TOC-4 (0.8 g, 0.17 mmol) of Example 6 was dissolved in THF (3.2 $cm^3$) in a 20 $cm^3$ vial, and perfluoro(2,5-dimethyl-3,6-dioxanonanoic)acid (0.17 g, 0.34 mmol) was added at room temperature. After stirring the reaction solution at 50° C. for 30 minutes, a reactant was precipitated in hexane twice or three times and filtered. After vacuum drying, a white solid final material, $[(R^1Sn)_{12}O_{14}(OH)_6]^{2+}(CF_3(CF_2)_2O(CF_3)CFCF_2O(CF_3)CFCOO^-)_2$ (hereinafter referred to as N-TOC-4) was obtained (0.4 g, yield: 50%).

$^1H$ NMR (400 MHz, CDOD, ppm): δ=2.33-2.76 (br, 24H), 1.45-1.70 (br, 24H)

IR [(KBr): v_max, (cm^(−1))] 1664, 1491, 1447, 1346, 1224, 1134, 1063, 995, 881, 839, 731, 572, 520 m/z (MALDI-TOF) 5765.09 [Exact mass: 5707.68 for $C_{114}H_{54}Sn_{12}O_{26}F_{190}$, 5781.82 for M+(Me)4N+]

A chemical reaction according to Example 8 is shown in Scheme 9 below.

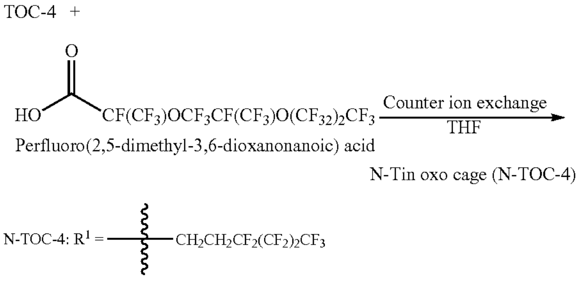

N-TOC-4 has a structure of Chemical Formula 5-1, in which two anions ($OH^-$) in TOC-4 of Chemical Formula 5-2 are substituted with "$R^2$" groups. The "$R^2$" group may be an anion of perfluorinated alkyl carboxylic acid. In N-TOC-4, "$R^1$" is as shown in Scheme 9.

Figure 13:
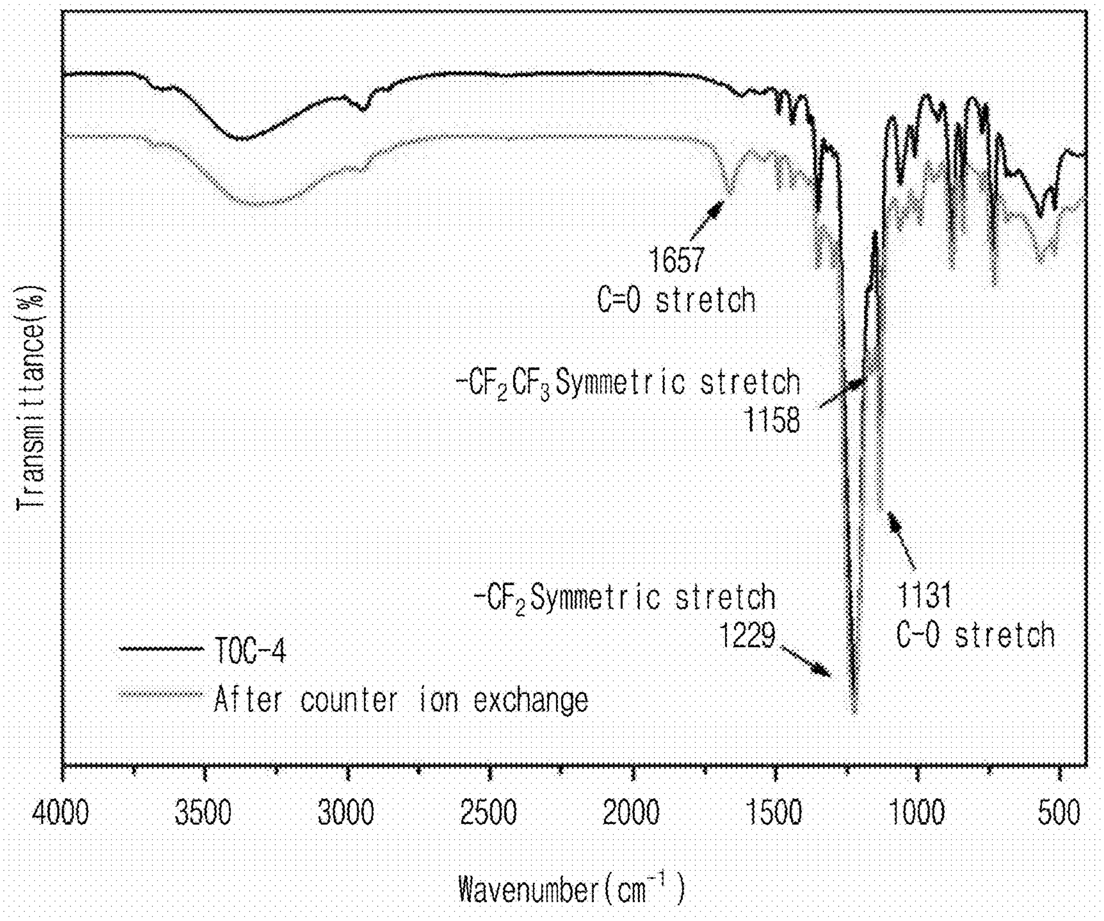
FIG. 13 is a view illustrating a FTIR spectrum before and after a process of preparing N-TOC-4 through a counter ion exchange reaction of tin oxide $[(R^1Sn)_{12}O_{14}(OH)_6]^{2+}(OH^-)_2$ (TOC-4) having a perfluorinated octyl chain (Example 8)

FIG. 13 is a view illustrating a FTIR spectrum before and after a process of preparing N-TOC-4 through a counter ion exchange reaction of tin oxide $[(R^1Sn)_{12}O_{14}(OH)_6]^{2+}(OH^-)_2$ (TOC-4) having a perfluorinated octyl chain (Example 8). Referring to FIG. 13, it may be seen that N-TOC-4 is synthesized.

<Example 9> Electron Beam Lithography: N-TOC-6 Application

A solution of N-TOC-6 (2 wt/vol %) synthesized in Example 7 was dissolved in PF-7600 (3-ethoxy-1,1,1,2,3,4,4,5,5,6,6,6-dodecafluoro-2-trifluoromethyl) (3M Corporation), was spin-coated on a Si substrate primed with vinyltrimethoxysilane (VTMS), at 500 rpm for 60 seconds, and then was heated at 80° C. for 1 minute to form a thin film (approximately 50 nm thick). Thereafter, the thin film was irradiated with an electron beam of 50 to 1,500 μC/$cm^2$ under an acceleration voltage of 80 keV, and then a development process was carried out using a mixture of 1,1,1,2,2,3,4,5,5,5-decafluoro-3-methoxy-4-(trifluoromethyl)pentane (HFE-7300) and perfluoro compounds of C5-18 (FC-3283) (1:3) for 5 seconds to form a negative resist pattern with a size of 60 to 100 nm.

<Example 10> Electron Beam Lithography: N-TOC-4 Application

A solution of N-TOC-4 (2 wt/vol %) synthesized in Example 8 was dissolved in PF-7600 (1,1,1,2,3,3-Hexafluoro-4-(1,1,2,3,3,3-hexafluoropropoxy)-pentane) (3M Corporation), was spin-coated on a Si substrate primed with vinyltrimethoxysilane (VTMS), at 1,500 rpm for 60 seconds, and then heated at 80° C. for 1 minute to form a thin film (approximately 50 nm thick). Thereafter, the thin film was irradiated with an electron beam of 50 to 1,500 μC/$cm^2$ under an acceleration voltage of 80 keV, and then a development process was carried out using PF-7600 for 5 seconds to form a negative resist pattern with a size of 30 to 50 nm.

Figure 14:
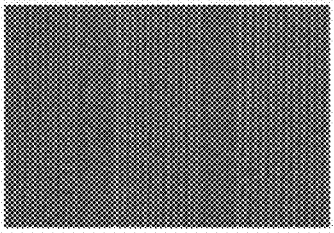
FIG. 14 is a view illustrating a formation of negative patterns of N-TOC-6 and N-TOC-4 fluorinated tin oxide resists obtained by electron beam lithography according to Examples 9 and 10.
Figure 14:
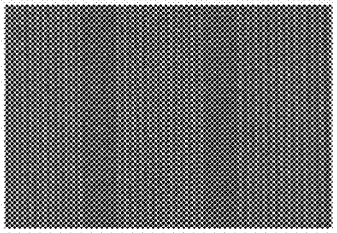

FIG. 14 is a view illustrating a formation of negative patterns of N-TOC-6 and N-TOC-4 fluorinated tin oxide resists obtained by electron beam lithography according to Examples 9 and 10. Referring to FIG. 14, it may be seen that an accurate, fine, and clean line-shaped resist pattern having a 30 nm critical dimension (CD) is formed.

<Example 11> Evaluation of Solubility Change Under Extreme Ultraviolet Irradiation: N-TOC-6 Application A solution of N-TOC-6 (1.2 wt/vol %) synthesized in Example 7 was dissolved in HFE-7500, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a development process was carried out using a mixture of HFE-7300 and FC-3283 (1:3) for 20 seconds, and it was confirmed that a negative resist pattern with exposure doses of 1 to 40 mJ/$cm^2$ was formed. Then, solubility characteristics were evaluated by measuring a thickness through an Alpha-Step® D-300 stylus profiler manufactured by KLA-Tencor.

<Example 12> Evaluation of Solubility Change Under Extreme Ultraviolet Irradiation: N-TOC-4 Application A solution of N-TOC-4 (1.3 wt/vol %) synthesized in Example 8 was dissolved in PF-7600, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a development process was carried out using PF-7600 for 5 seconds, and it was confirmed that a negative resist pattern with exposure doses of 1 to 40 mJ/cm$^2$ was formed. Then, solubility characteristics were evaluated by measuring a thickness through an Alpha-Step® D-300 stylus profiler manufactured by KLA-Tencor.

Figure 15:
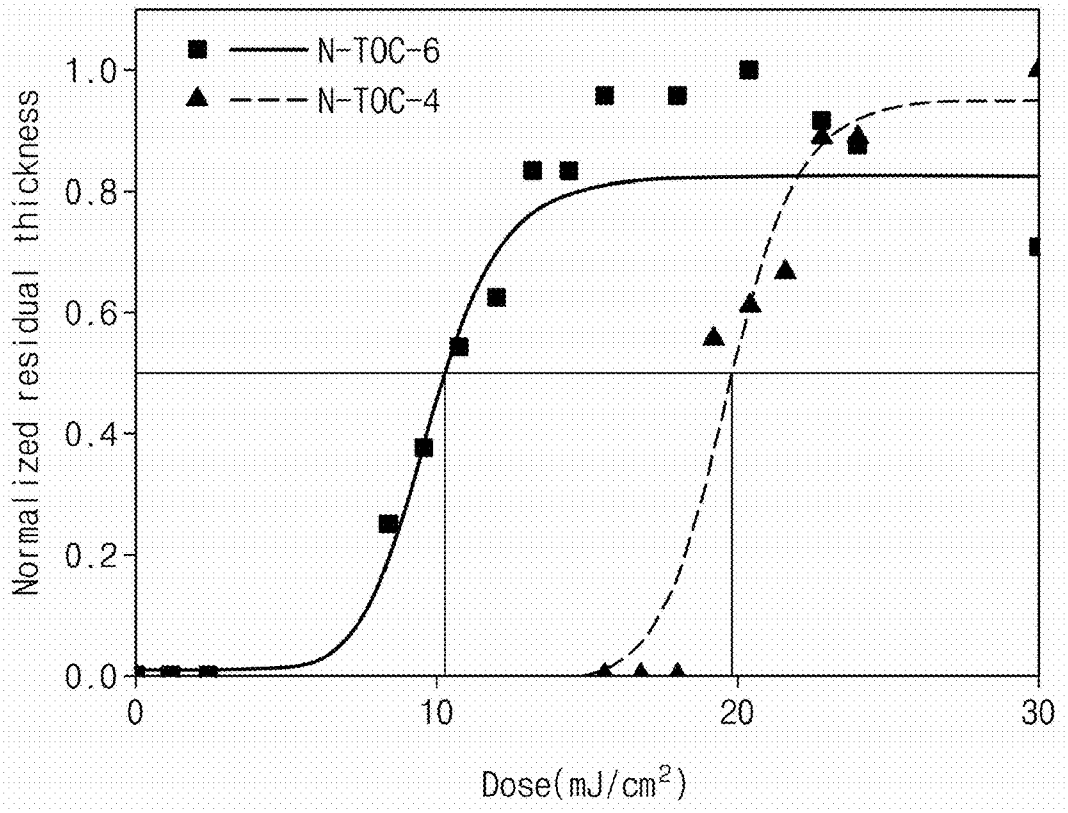
FIG. 15 is a graph evaluating solubility characteristics of N-TOC-6 and N-TOC-4 fluorinated tin oxide resists obtained by exposing to extreme UV according to Examples 11 and 12.

FIG. 15 is a graph evaluating solubility characteristics of N-TOC-6 and N-TOC-4 fluorinated tin oxide resists obtained by exposing to extreme UV according to Examples 11 and 12. Referring to FIG. 15, it may be seen that N-TOC-6 and N-TOC-4 have excellent solubility.

<Example 13> Pattern Fabricating Through Extreme Ultraviolet Irradiation: N-TOC-6 Application A solution of N-TOC-6 synthesized in Example 7 (1.2 wt/vol %) was dissolved in HFE-7500, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a development process was carried out using a mixture of HFE-7300 and FC-3283 (1:3) for 20 seconds, and it was confirmed that a negative resist pattern with reduced solubility at exposure doses (sensitivity) of 10 to 100 mJ/cm$^2$ was formed.

<Example 14> Pattern Fabricating Through Extreme Ultraviolet Irradiation: N-TOC-4 Application A solution of N-TOC-4 synthesized in Example 8 (1.3 wt/vol %) was dissolved in PF-7600, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a development process was carried out using PF-7600 for 5 seconds, and it was confirmed that a negative resist pattern with reduced solubility at exposure doses (sensitivity) of 10 to 100 mJ/cm$^2$ was formed.

Figure 16:
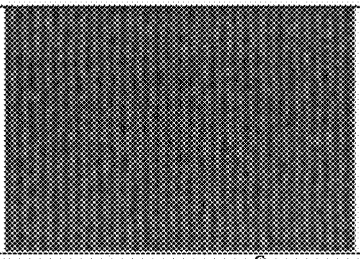
FIG. 16 is a view illustrating a formation of negative patterns of N-TOC-6 and N-TOC-4 fluorinated tin oxide resists obtained by performing extreme ultraviolet lithography according to Examples 13 and 14.
Figure 16:
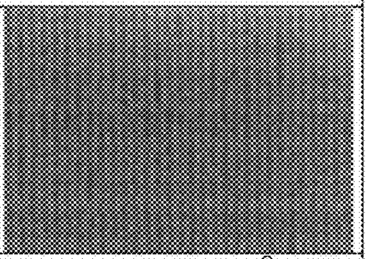

FIG. 16 is a view illustrating a formation of negative patterns of N-TOC-6 and N-TOC-4 fluorinated tin oxide resists obtained by performing extreme ultraviolet lithography according to Examples 13 and 14. Referring to FIG. 16, it may be seen that an accurate, fine, and clean line-shaped resist pattern having about 9 nm CD is formed.

<Example 15> Pattern Fabricating Using Post-Exposure Heating (PEB) after Extreme Ultraviolet Irradiation: N-TOC-6 Application A solution of N-TOC-6 synthesized in Example 7 (1.2 wt/vol %) was dissolved in HFE-7500, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a post-exposure heating process (PEB) was performed at 150° C. for 2 minutes. A development process was carried out using a mixed solution of HFE-7300 and FC-3283 (3:1) for 5 seconds, and it was confirmed that a negative resist pattern with reduced solubility at exposure doses (sensitivity) of 10 to 100 mJ/cm$^2$ was formed.

<Example 16> Pattern Fabricating Using Post-Exposure Bake (PEB) after Extreme Ultraviolet Irradiation: N-TOC-4 Application A solution of N-TOC-4 synthesized in Example 8 (1.3 wt/vol %) was dissolved in PF-7600, was spin-coated on a Si substrate primed with vinyltrimethoxysilane (VTMS), at 1,500 rpm for 60 seconds, and then was heated at 80° C. for 1 minute to form a thin film (approximately 25 nm thick). Thereafter, the thin film was irradiated with extreme ultraviolet (EUV) using an MET5 exposure machine owned by Lawrence Berkeley National Laboratory, and then a post-exposure heating process (PEB) was performed at 150° C. for 2 minutes. A development process was carried out using PF-7600 for 5 seconds, and it was confirmed that a negative resist pattern with reduced solubility at exposure doses (sensitivity) of 10 to 100 mJ/cm$^2$ was formed.

Figure 17:
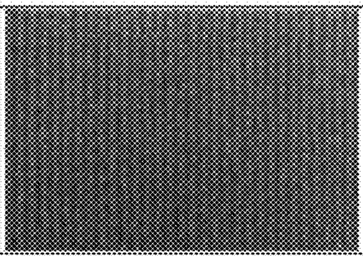
FIG. 17 is a view illustrating a formation of negative patterns of N-TOC-6 and N-TOC-4 fluorinated tin oxide resists obtained by performing extreme ultraviolet lithography including a post-exposure bake (PEB) process according to Examples 15 and 16.
Figure 17:
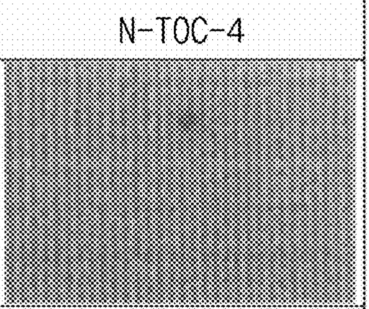

FIG. 17 is a view illustrating a formation of negative patterns of N-TOC-6 and N-TOC-4 fluorinated tin oxide resists obtained by performing extreme ultraviolet lithography including a post-exposure bake (PEB) process according to Examples 15 and 16. Referring to FIG. 17, it may be seen that an accurate, fine, and clean line-shaped resist pattern having about 9 nm CD is formed.

<Example 17> Measurement and Comparative Experiment of Dry Etching Rate of N-TOC-6 and N-TOC-4

An N-TOC-4 thin film with a thickness of 380 nm and an N-TOC-6 thin film with a thickness of 210 nm were formed on the Si substrate primed with vinyltrimethoxysilane (VTMS), respectively. For comparison of etching resistance according to metal content, a fluorinated organic monomolecular resist [L6, Korean Patent Application No. 10-2019-0016033] having a thickness of 673 nm and a commercial KrF resist having a thickness of 255 nm (provided by Dongjin Semichem) were added. Thereafter, the four thin films were put under an RF power of 100 W and a frequency of 100 kHz, and a mixture of 2 sccm of $O_2$ and 18 sccm of $CF_4$ which is an etching gas, was added to perform dry etching for 0 to 80 seconds at intervals of 20 seconds. Then, the remaining thin film thickness depending on the drying time was measured using an ellipsometer.

Figure 18:
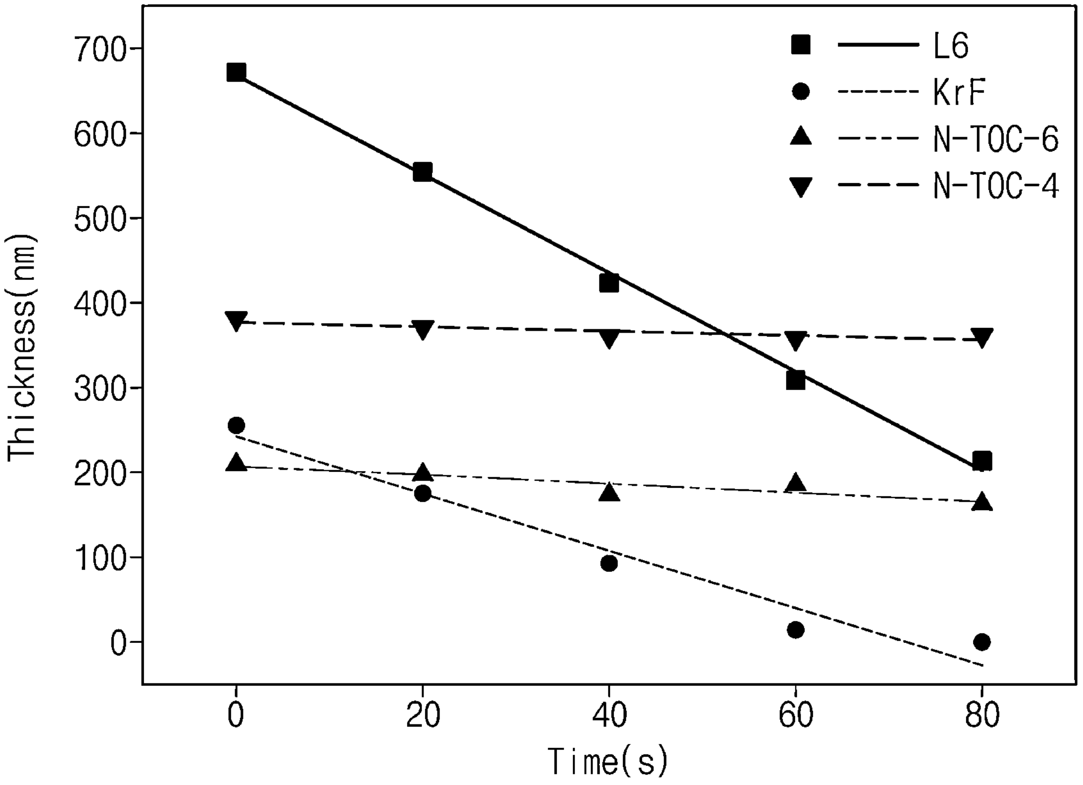
FIG. 18 is a graph comparing dry etching rates of N-TOC-6 and N-TOC-4 according to Example 17 as measured.

FIG. 18 is a graph comparing dry etching rates of N-TOC-6 and N-TOC-4 according to Example 17 as measured.

Referring to FIG. 18, according to Example 17, the thicknesses of N-TOC-6 and N-TOC-4 hardly change regardless of time. Accordingly, it may be seen that N-TOC-6 and N-TOC-4 have excellent etching resistance.

The resist material according to embodiments of the disclosure is the organometallic compound represented by Chemical Formula 1 above. The organometallic compound has the structure in which the two counter anions are combined with the tin oxide nanocluster structure of the divalent cations. Thus, the organometallic compound may be stabilized in the electrically neutral state, generally. The organometallic compound has a smaller particle size than that of a polymer resin of a chemically amplified resist (CAR) photoresist (PR) and has a uniform size distribution, and thus it is advantageous in terms of securing resolution, line edge roughness (LER), and line width roughness (LWR), which are the performance indicators of the resist pattern.

The organometallic compound contains the four or more fluorine atoms, and thus has strong hydrophobicity and is resistant to moisture. Accordingly, the resist composition including the organometallic compound has good storage safety.

The organometallic compound including tin has high absorbance for the extreme ultraviolet and excellent etching resistance. Accordingly, when a pattern is formed using a resist composition including the organometallic compound, a fine, clean and accurate pattern may be formed.

While embodiments are described above, a person skilled in the art may understand that many modifications and variations are made without departing from the spirit and scope of the disclosure defined in the following claims. Accordingly, the example embodiments of the disclosure should be considered in all respects as illustrative and not restrictive, with the spirit and scope of the disclosure being indicated by the appended claims.

What is claimed is:

1. An organometallic compound comprising a metal combined with at least one ligand comprising four or more fluorine atoms, wherein the organometallic compound has one structure selected from the following Chemical Formulas 2 to 5:

(Chemical Formula 2)

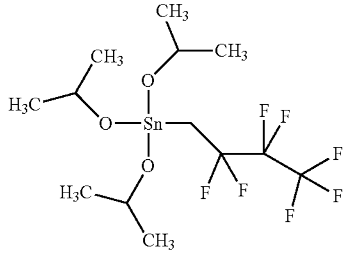

(Chemical Formula 3)

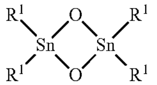

-continued (Chemical Formula 4)

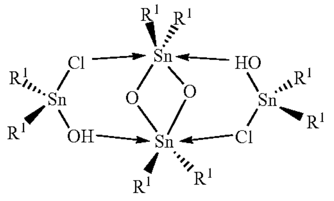

(Chemical Formula 5)

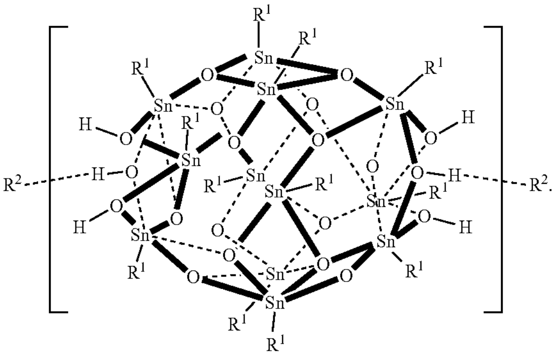

wherein one of $R^1$ and $R^2$ is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of $R^1$ and $R^2$ is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, a is an integer of 1 to 20, d and e are each independently an integer of 0 to 5, c is an integer of 0 to 20, provided that c is an integer of 3 to 20 for $C_aH_c$ as the other of $R^1$ and $R^2$, and b is an integer of 4 to 30.

2. The organometallic compound of claim 1, wherein the organometallic compound has a cage shape.

3. The organometallic compound of claim 1, wherein $R^1$ has one structure selected from

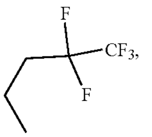

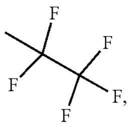

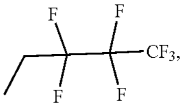

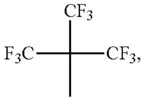

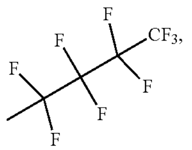

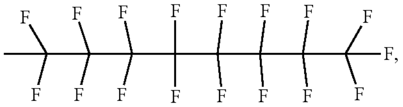

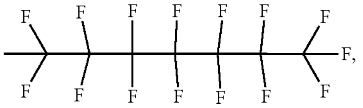

-continued

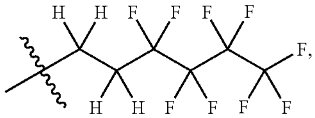

, and

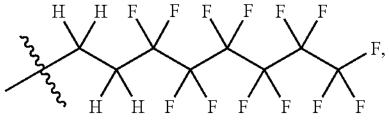

, and wherein $R^2$ has a structure of

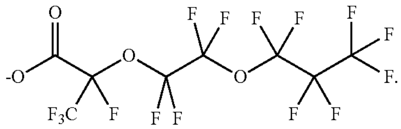

.

4. The organometallic compound of claim 1, wherein the organometallic compound has a structure represented by Chemical Formula 2:

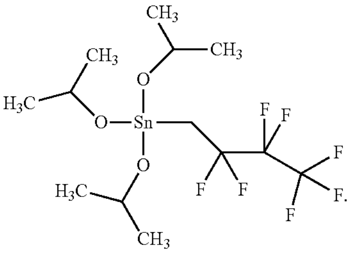 [SMILES: CC(C)[O][Sn]([CH2]C(F)(F)C(F)(F)C(F)(F)F)([O]C(C)C)[O]C(C)C]

.

5. A resist composition comprising:

an organometallic compound; and an organic solvent, wherein the organometallic compound has a structure selected from the following Chemical Formulas 2 to 5:

(Chemical Formula 2)

(Chemical Formula 2)

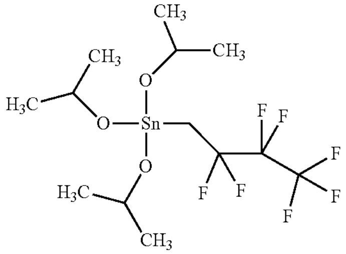

(Chemical Formula 3)

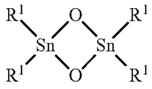

-continued (Chemical Formula 4)

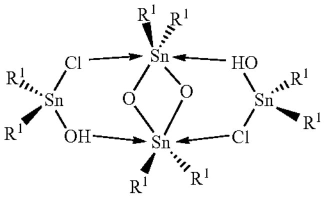

(Chemical Formula 5)

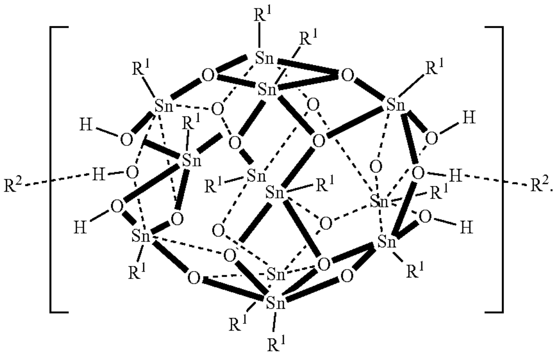

.

wherein:

one of $R^1$ and $R^2$ is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of $R^1$ and $R^2$ is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, a is an integer of 1 to 20, d and e are each independently an integer of 0 to 5, c is an integer of 0 to 20, provided that c is an integer of 3 to 20 for $C_aH_c$ as the other of $R^1$ and $R^2$, and b is an integer of 4 to 30.

6. The resist composition of claim 5, wherein the organometallic compound has a cage shape.

7. The resist composition of claim 5, wherein $R^1$ has one structure selected from

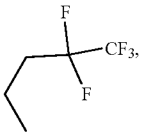

,

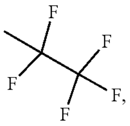

,

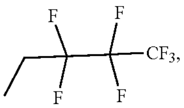

,

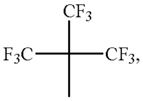

,

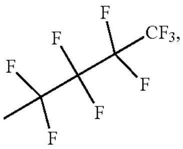

,

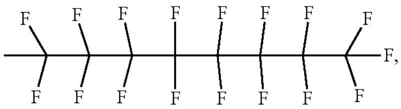

,

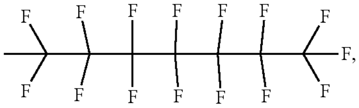

,

-continued

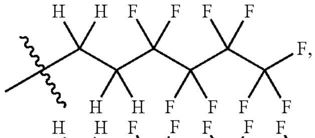

, and

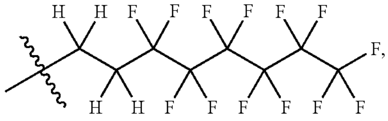

, and wherein $R^2$ has a structure of

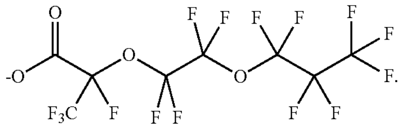

.

8. The resist composition of claim 5, wherein the resist composition comprises the organometallic compound in an amount of 1 to 30 wt. % based on a total weight of the resist composition, and wherein the resist composition comprises the organic solvent in an amount of 70 to 99 wt. % based on the total weight of the resist composition.

9. The resist composition of claim 5, wherein the organic solvent is at least one of methyl isobutyl carbinol (MIBC), ether, propylene glycol monomethyl ether acetate (PGMEA), propylene glycol monomethyl ether (PGME), ethyl lactate (EL), P-hydroxy P-methylbutyric acid (HBM) or a fluorine-containing material.

10. The resist composition of claim 5, further comprising at least one of a photo acid generator, a radical quencher, a photolysis quencher, a thermal acid generator, surfactant, and a base quencher in an amount of 0 to 10 wt. % based on a total weight of the resist composition.

11. The resist composition of claim 5, wherein the organometallic compound has a structure represented by Chemical Formula 2:

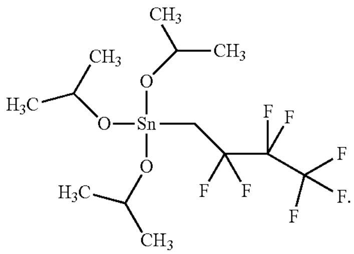 [SMILES: CC(C)[O][Sn]([CH2]C(F)(F)C(F)(F)C(F)(F)F)([O]C(C)C)[O]C(C)C]

.

12. A method of fabricating a semiconductor device, the method comprising:

preparing a resist composition including an organometallic compound and an organic solvent;

coating the resist composition on a substrate to form a resist layer;

performing a soft bake process to evaporate the organic solvent;

performing an exposure process and a post-bake process to change a portion of the resist layer into a mask pattern; and performing a development process to remove the resist layer while retaining the mask pattern, wherein the organometallic compound has a structure selected from the following Chemical Formulas 2 to 5:

(Chemical Formula 2)

(Chemical Formula 2)

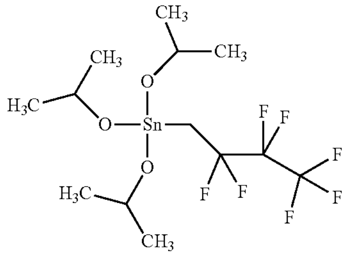

(Chemical Formula 3)

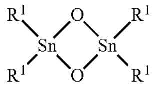

(Chemical Formula 4)

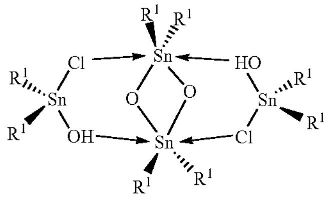

(Chemical Formula 5)

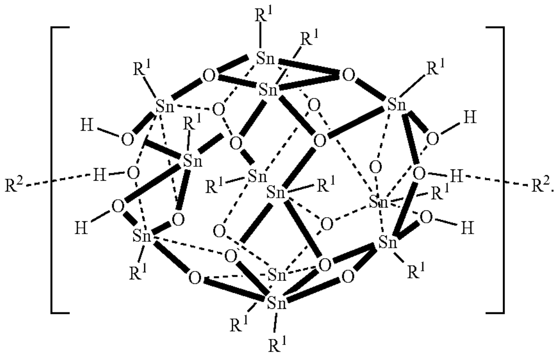

.

wherein:

one of $R^1$ and $R^2$ is $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, the other of $R^1$ and $R^2$ is $C_aH_c$, $C_aF_bH_c$, $C_aF_bH_cN_d$, $C_aF_bH_cP_d$, $C_aF_bH_cS_d$, $C_aF_bH_cO_d$, $C_aF_bH_cN_dS_e$, $C_aF_bH_cP_dS_e$, $C_aF_bH_cN_dO_e$, or $C_aF_bH_cP_dO_e$, a is an integer of 1 to 20, d and e are each independently an integer of 0 to 5, c is an integer of 0 to 20, provided that c is an integer of 3 to 20 for $C_aH_e$ as the other of $R^1$ and $R^2$, and b is an integer of 4 to 30.

13. The method of claim 12, wherein the development process comprises developing with a developer comprising fluorine.

14. The method of claim 12, wherein the organometallic compound has a cage shape.

15. The method of claim 12, wherein $R^1$ has one structure selected from

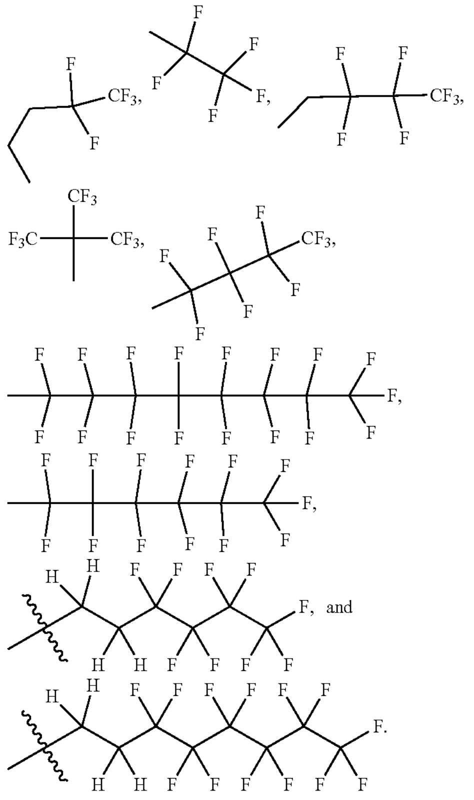

wherein $R^2$ has a structure of

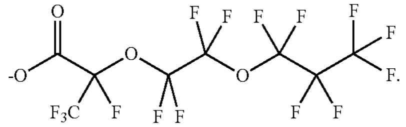

16. The method of claim 12, wherein the resist composition comprises the organometallic compound in an amount of 1 to 30 wt. % based on a total weight of the resist composition, and wherein the resist composition comprises the organic solvent in an amount of 70 to 99 wt. % based on the total weight of the resist composition.

17. The method of claim 12, wherein the organic solvent is at least one of methyl isobutyl carbinol (MIBC), ether, propylene glycol monomethyl ether acetate (PGMEA), propylene glycol monomethyl ether (PGME), ethyl lactate (EL), P-hydroxy P-methylbutyric acid (HBM) or a fluorine-containing material.

18. The method of claim 12, wherein the resist composition further comprises at least one of a photo acid generator, a radical quencher, a photolysis quencher, a thermal acid generator, surfactant, and a base quencher in an amount of 0 to 10 wt. % based on a total weight of the resist composition.

19. The method of claim 12, wherein, in the exposure process and the post-bake process, a radical combination between organometallic compounds occurs in a portion of the resist layer to increase molecular weight.

20. The method of claim 12, wherein the organometallic compound has a structure represented by Chemical Formula 2:

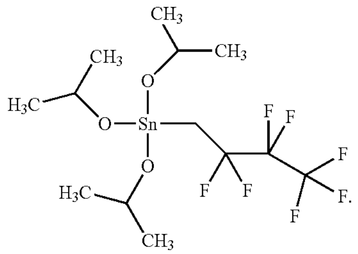

* * * * *